US008432740B2

(12) United States Patent
Li

(10) Patent No.: US 8,432,740 B2
(45) Date of Patent: Apr. 30, 2013

(54) PROGRAM ALGORITHM WITH STAIRCASE WAVEFORM DECOMPOSED INTO MULTIPLE PASSES

(75) Inventor: Yan Li, Milpitas, CA (US)

(73) Assignee: SanDisk Technologies Inc., Plano, TX (US)

( * ) Notice: Subject to any disclaimer, the term of this patent is extended or adjusted under 35 U.S.C. 154(b) by 108 days.

(21) Appl. No.: 13/188,352

(22) Filed: Jul. 21, 2011

(65) Prior Publication Data

US 2013/0021849 A1 Jan. 24, 2013

(51) Int. Cl.
*G11C 16/04* (2006.01)
(52) U.S. Cl.
USPC ............ 365/185.19; 365/185.22; 365/185.18; 365/185.21
(58) Field of Classification Search ............. 365/185.19, 365/185.22, 185.21, 185.18, 185.23, 185.03
See application file for complete search history.

(56) References Cited

U.S. PATENT DOCUMENTS

| 5,070,032 | A | 12/1991 | Yuan et al. |
| 5,095,344 | A | 3/1992 | Harari |
| 5,172,338 | A | 12/1992 | Mehrotra et al. |
| 5,289,401 | A | 2/1994 | Shima |
| 5,313,421 | A | 5/1994 | Guterman et al. |
| 5,315,541 | A | 5/1994 | Harari et al. |
| 5,343,063 | A | 8/1994 | Yuan et al. |
| 5,570,315 | A | 10/1996 | Tanaka et al. |
| 5,595,924 | A | 1/1997 | Yuan et al. |
| 5,661,053 | A | 8/1997 | Yuan |
| 5,701,266 | A | 12/1997 | Fazio et al. |
| 5,729,489 | A | 3/1998 | Fazio et al. |
| 5,768,192 | A | 6/1998 | Eitan |
| 5,903,495 | A | 5/1999 | Takeuchi et al. |
| 6,011,725 | A | 1/2000 | Eitan |
| 6,046,935 | A | 4/2000 | Takeuchi et al. |
| 6,222,762 | B1 | 4/2001 | Guterman et al. |
| 6,850,441 | B2 | 2/2005 | Mokhlesi et al. |

(Continued)

FOREIGN PATENT DOCUMENTS

| EP | 0 913 832 A1 | 5/1999 |
| EP | 1 324 343 A2 | 7/2003 |

OTHER PUBLICATIONS

Eitan et al., "NROM: A Novel Localized Trapping, 2-Bit Non-Volatile Memory Cell," IEEE Electron Device Letters, vol. 21, No. 11, Nov. 2000, pp. 543-545.

(Continued)

*Primary Examiner* — David Lam
(74) *Attorney, Agent, or Firm* — Davis Wright Tremaine LLP

(57) ABSTRACT

Programming algorithms suitable for non-volatile memory devices are presented, where the usual staircase type of waveform is decomposed into multiple passes. The same pulses are used, but their order is different, being broken down into N subsets of every N-th pulse so that there are N programming passes. For example, in a four pass version the first pass would sequentially have pulses (1, 5, 9, . . . ) of the staircase; the second pass would have pulses (2, 6, 10, . . . ); and so on for the third and fourth passes. By using a large step size for stepping up the program voltage $V_{PGM}$, pre-verify and shifted verify margins for the different passes, a narrow distribution can be obtained with multiple passes. Also, in a complementary set of features, a quick pass write (QPW) can be done without the drawback of doing QPW verify by the use of shared verify levels.

13 Claims, 25 Drawing Sheets

U.S. PATENT DOCUMENTS

| | | | |
|---|---|---|---|
| 7,073,103 B2 | 7/2006 | Gongwer et al. | |
| 7,158,421 B2 | 1/2007 | Li et al. | |
| 7,206,230 B2 | 4/2007 | Li et al. | |
| 7,243,275 B2 | 7/2007 | Gongwer et al. | |
| 7,489,549 B2 | 2/2009 | Mokhlesi | |
| 7,502,255 B2 | 3/2009 | Li | |
| 7,539,061 B2 | 5/2009 | Lee | |
| 7,633,802 B2 | 12/2009 | Mokhlesi | |
| 7,684,249 B2 * | 3/2010 | Chen et al. | 365/185.19 |
| 7,800,945 B2 | 9/2010 | Cernea | |
| 7,826,271 B2 | 11/2010 | Cernea | |
| 7,961,512 B2 | 6/2011 | Li et al. | |
| 2006/0140007 A1 | 6/2006 | Cernea et al. | |
| 2008/0247253 A1 | 10/2008 | Nguyen et al. | |
| 2008/0247254 A1 | 10/2008 | Nguyen et al. | |
| 2008/0250300 A1 | 10/2008 | Mokhlesi et al. | |
| 2009/0168537 A1 | 7/2009 | Kim | |
| 2009/0237999 A1 | 9/2009 | Li | |
| 2010/0061151 A1 | 3/2010 | Miwa et al. | |
| 2010/0091568 A1 | 4/2010 | Li et al. | |
| 2010/0091573 A1 | 4/2010 | Li et al. | |
| 2010/0157678 A1 | 6/2010 | Mokhlesi | |
| 2010/0172179 A1 | 7/2010 | Gorobets et al. | |
| 2010/0172180 A1 | 7/2010 | Paley et al. | |
| 2010/0195398 A1 | 8/2010 | Sekar et al. | |
| 2011/0149651 A1 | 6/2011 | Gorobets et al. | |

OTHER PUBLICATIONS

Kim et al., A 32Gb MLC NAND Memory with $V_{th}$ Margin-Expanding Schemes in 26nm CMOS, IEEE International Solid-State Circuits Conference, Feb. 2011, pp. 202-204.

U.S. Appl. No. 13/072,387 titled "Erase and Programming Techniques to Reduce the Widening of State Distributions in Non-Volatile Memories filed," filed Mar. 25, 2011, 27 pages.

Communication Relating to the Results of the Partial International Search, International Application No. PCT/US2012/045605 mailed Oct. 5, 2012, 4 pages.

* cited by examiner

Programming into Four States Represented by a 2-bit Code

Conventional Programming with Alternating
Program/Verify Sequence for a 4-state Memory

| ADL | D2 Data |
|---|---|
| BDL | D2 Data |
| CDL | Inhibit |
| DDL | QPW Lockout |

Dynamic Latch in SA

| ADL | D2 Data/Inhibit |
|---|---|
| BDL | D2 Data/Inhibit |
| CDL | QPW Lockout |

PROGRAM ALGORITHM WITH STAIRCASE WAVEFORM DECOMPOSED INTO MULTIPLE PASSES

FIELD OF THE INVENTION

This invention relates generally to non-volatile semiconductor memory such as electrically erasable programmable read-only memory (EEPROM) and flash EEPROM, and specifically to programming algorithms to write data with increased accuracy.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile and retains its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card, are ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell. When the threshold voltage is partitioned into two distinct regions, each memory cell will be able to store one bit of data. Similarly, when the threshold voltage window is partitioned into more than two distinct regions, each memory cell will be able to store more than one bit of data.

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current IREF). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

The memory devices typically comprise one or more memory chips that may be mounted on a card. Each memory chip comprises an array of memory cells supported by peripheral circuits such as decoders and erase, write and read circuits. The more sophisticated memory devices operate with an external memory controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also non-volatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performances, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

To accurately store data, it needs to be accurately written. To increase data with greater density, memory devices are being made to store multiple bits of data per cell. There is also a trend to the scaling will make the program more noisy due to oxide interface trapping and program/erase could saturate, so that the data states are required to all be contained within a small window of threshold voltages. These two trends require that the data to be written with tighter distributions. Also, as circuits are being made on smaller scale to also increase storage densities, the smaller devices introduce or amplify phenomena that affect writing accuracy.

Therefore there is a general need for high capacity and high performance non-volatile memory. In particular, there is a need to have a high capacity nonvolatile memory with improved programming performance where the aforementioned disadvantage is minimized.

SUMMARY OF INVENTION

According to a first set of aspects, a method of programming a non-volatile memory device is presented. The method includes applying pulses forming a staircase of increasing amplitude to a first wordline and, after applying each pulse to the first wordline, performing a verifying operation for memory cells along the first wordline. The series of pulse is applied to the first wordline as a series of a plurality of N subsets of the staircase, the series including at least a first subset and a second subset. The first subset includes the first and every Nth subsequent pulse of the staircase applied sequentially in order of increasing amplitude, the second subset includes the second and every Nth subsequent pulse of the staircase applied sequentially in order of increasing amplitude, and the second subset is applied subsequent to applying the first subset. The method also includes locking out the memory cells along the first wordline from farther programming in response to verifying at the subset's verify level corresponding to the cells' target data state, wherein each subset uses a different set of verify levels for verify operations, and, subsequent to applying the first subset and prior to applying the second subset, unlocking the memory cells along the first wordline to allow further programming.

Other aspects of the present application present a method of writing a plurality of memory cells each into one of a plurality of target data states. The method includes applying a series of pulses to a first wordline and, after applying each pulse to the first wordline, performing a verify operation for memory cells along the first wordline. The verify operation includes an initial verify levels and a lockout verify level for each target data state, wherein the initial verify level is lower than the corresponding lock verify level for each of the target data states. The bias on the memory cells are individually altered to program more slowly in response to verifying at the corresponding to the cell's initial verify level and individually locking out the memory cells along the first wordline individually locked out from further programming in response to verifying at the corresponding to the cell's lockout verify level. An initial verify level for a first of the multi-states is the same as the lockout verify level for a second of the multi-states, the first of the multi-states being different than the second of the multi-states.

Various aspects, advantages, features and embodiments of the present invention are included in the following description of exemplary examples thereof, which description should be taken in conjunction with the accompanying drawings. All patents, patent applications, articles, other publications, documents and things referenced herein are hereby incorporated herein by this reference in their entirety for all purposes. To the extent of any inconsistency or conflict in the definition or use of terms between any of the incorporated publications, documents or things and the present application, those of the present application shall prevail.

DETAILED DESCRIPTION OF THE PREFERRED EMBODIMENTS

Memory System

FIG. 1 to FIG. 11 illustrate example memory systems in which the various aspects of the present invention may be implemented.

Figure 1:
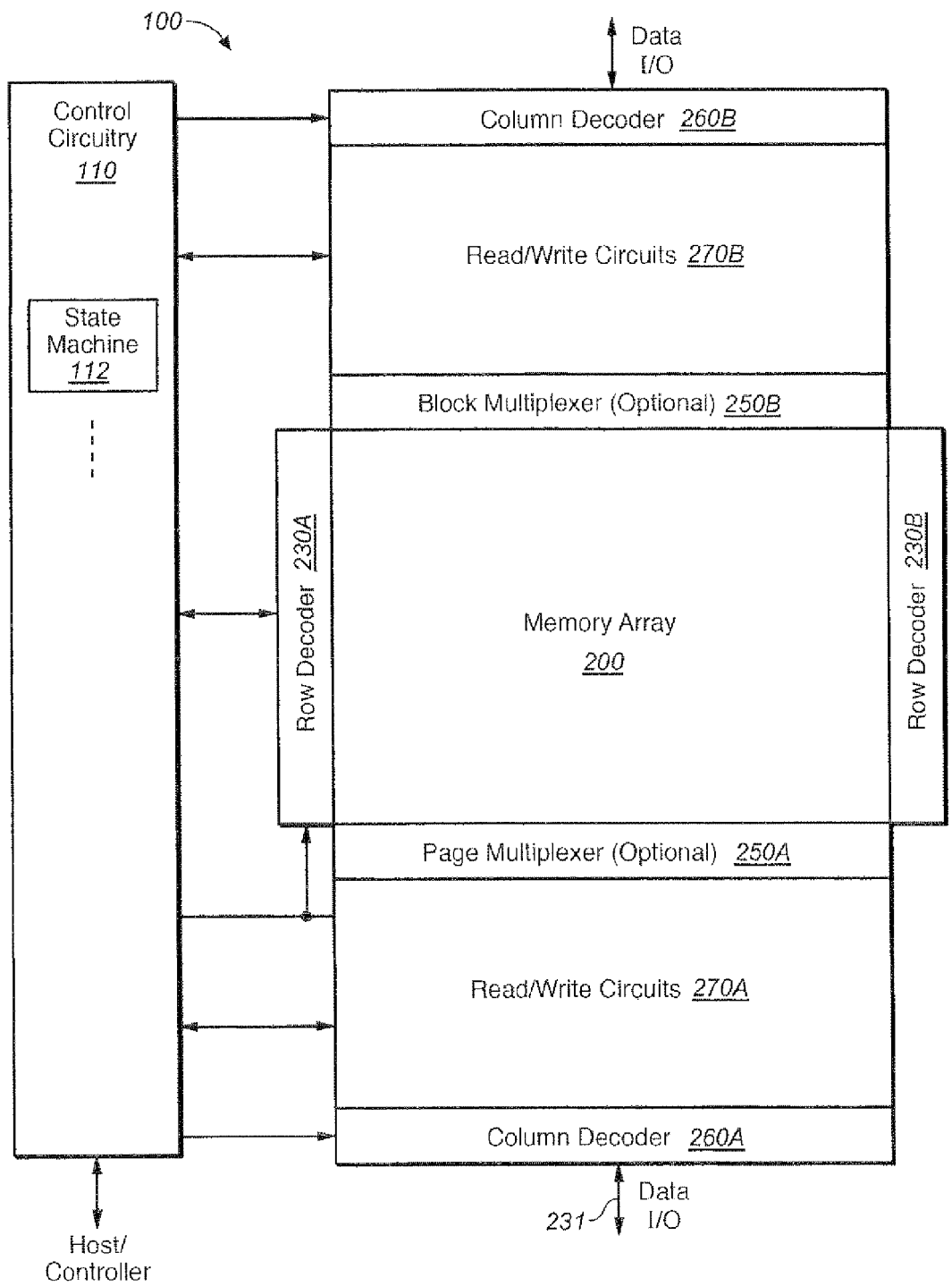
FIG. 1 illustrates schematically the functional blocks of a non-volatile memory chip in which the present invention may be implemented.

FIG. 1 illustrates schematically the functional blocks of a non-volatile memory chip in which the present invention may be implemented. The memory chip 100 includes a two-dimensional array of memory cells 200, control circuitry 210, and peripheral circuits such as decoders, read/write circuits and multiplexers.

Figure 4:
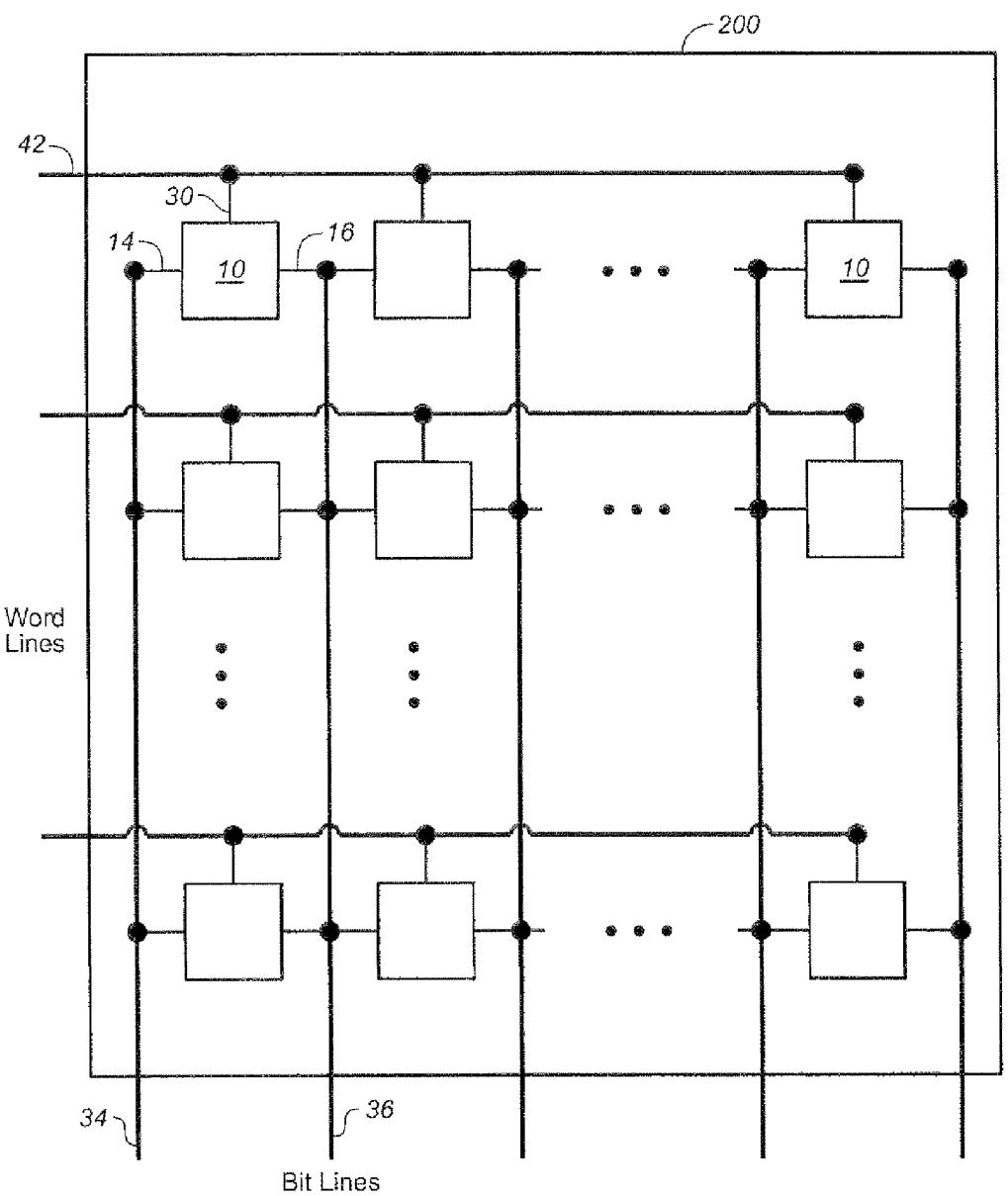
FIG. 4 illustrates an example of an NOR array of memory cells.

The memory array 200 is addressable by word lines via row decoders 230 (split into 230A, 230B) and by bit lines via column decoders 260 (split into 260A, 260B) (see also FIGS. 4 and 5.) The read/write circuits 270 (split into 270A, 270B) allow a page of memory cells to be read or programmed in parallel. A data I/O bus 231 is coupled to the read/write circuits 270.

In a preferred embodiment, a page is constituted from a contiguous row of memory cells sharing the same word line. In another embodiment, where a row of memory cells are partitioned into multiple pages, block multiplexers 250 (split into 250A and 250B) are provided to multiplex the read/write circuits 270 to the individual pages. For example, two pages, respectively formed by odd and even columns of memory cells are multiplexed to the read/write circuits.

FIG. 1 illustrates a preferred arrangement in which access to the memory array 200 by the various peripheral circuits is implemented in a symmetric fashion, on opposite sides of the array so that the densities of access lines and circuitry on each side are reduced in half. Thus, the row decoder is split into row decoders 230A and 230B and the column decoder into column decoders 260A and 260B. In the embodiment where a row of memory cells are partitioned into multiple pages, the page multiplexer 250 is split into page multiplexers 250A and 250B. Similarly, the read/write circuits 270 are split into read/write circuits 270A connecting to bit lines from the bottom and read/write circuits 270B connecting to bit lines from the top of the array 200. In this way, the density of the read/write modules, and therefore that of the sense modules 380, is essentially reduced by one half.

The control circuitry 110 is an on-chip controller that cooperates with the read/write circuits 270 to perform memory operations on the memory array 200. The control circuitry 110 typically includes a state machine 112 and other circuits such as an on-chip address decoder and a power control module (not shown explicitly). The state machine 112 provides chip level control of memory operations. The control circuitry is in communication with a host via an external memory controller.

The memory array 200 is typically organized as a two-dimensional array of memory cells arranged in rows and columns and addressable by word lines and bit lines. The array can be formed according to an NOR type or an NAND type architecture.

Figure 2:
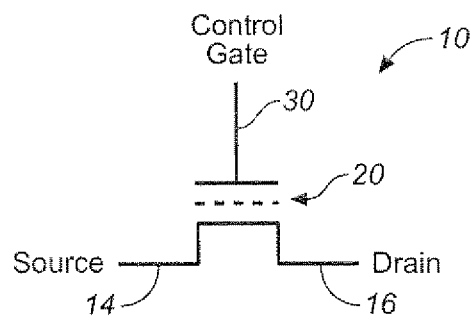
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
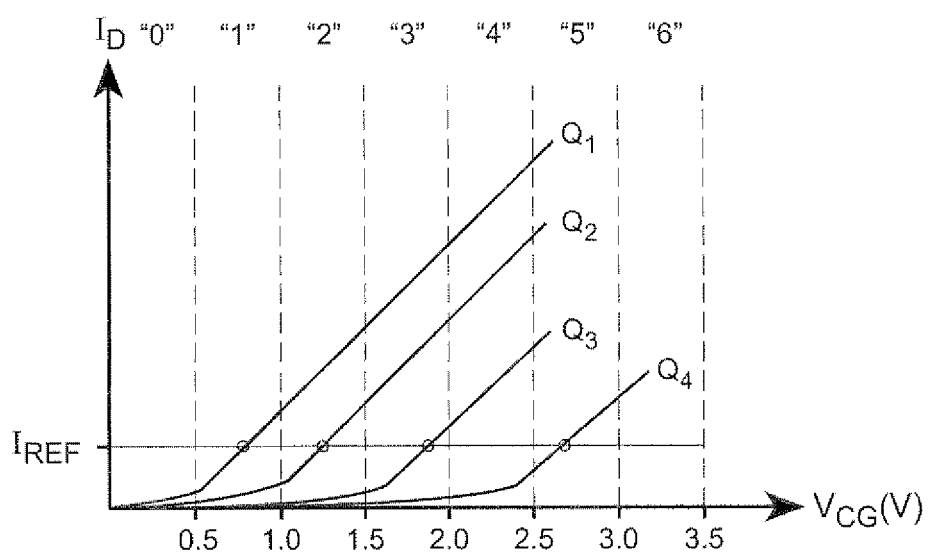
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in interval of 0.5V each. For example, if a reference current, IREF of 2 µA is used as shown, then the cell programmed with Q1 may be considered to be in a memory state "1" since its curve intersects with $I_{REF}$ in the region of the threshold window demarcated by VCG=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

FIG. 4 illustrates an example of an NOR array of memory cells. In the memory array 200, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 5A:
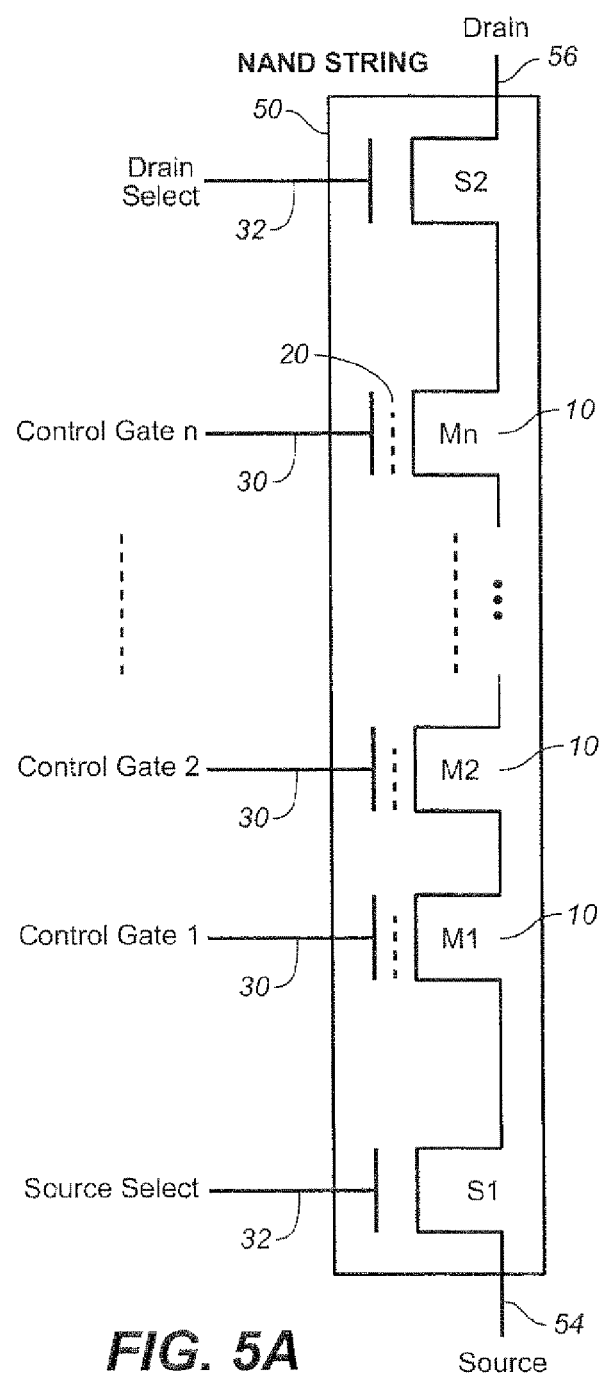
FIG. 5A illustrates schematically a string of memory cells organized into an NAND string.

FIG. 5A illustrates schematically a string of memory cells organized into an NAND string. An NAND string 50 comprises of a series of memory transistors M1, M2, . . . Mn (e.g., 4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 5B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 5B:
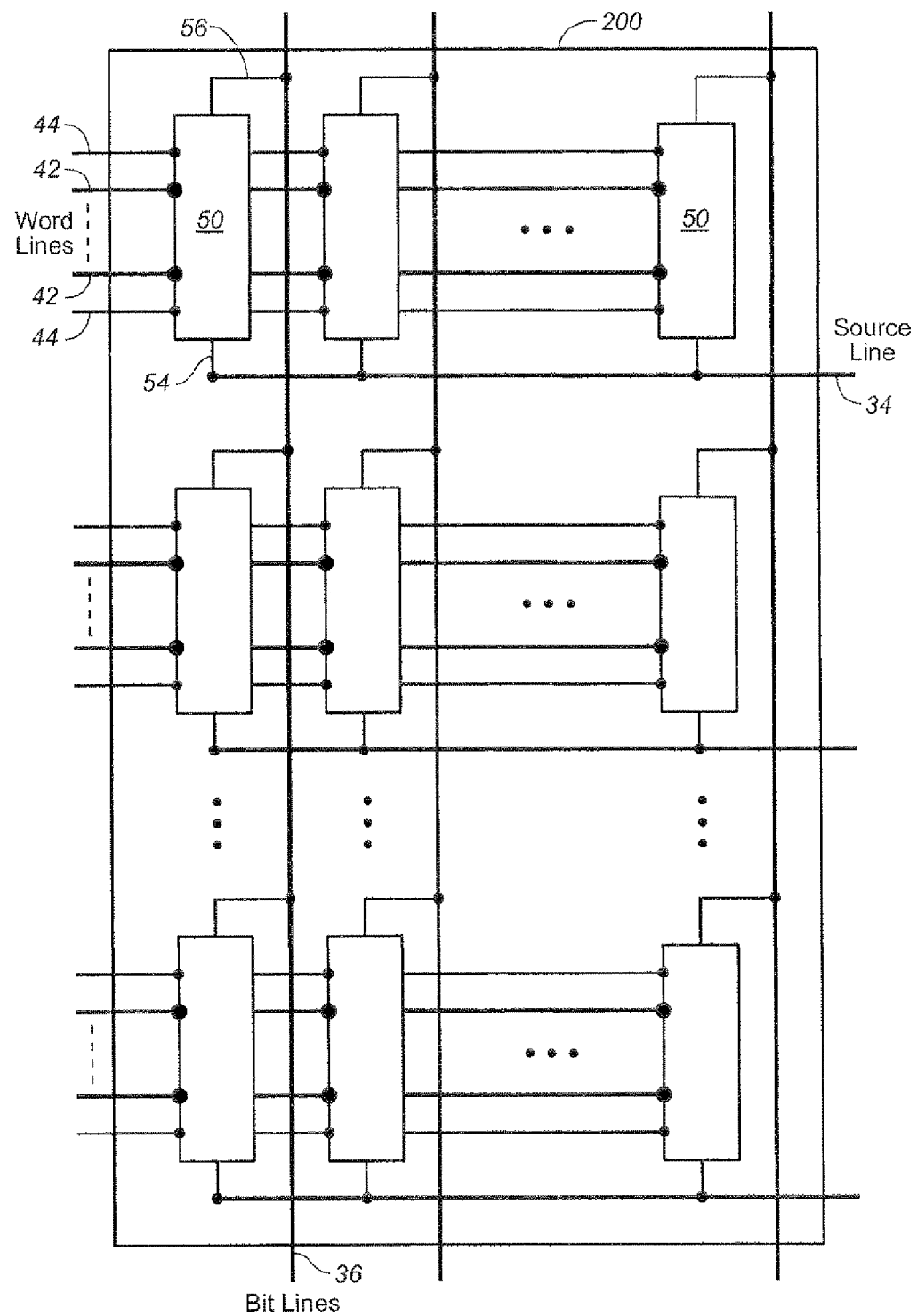
FIG. 5B illustrates an example of an NAND array 200 of memory cells, constituted from NAND strings 50 such as that shown in FIG. 5A.

FIG. 5B illustrates an example of an NAND array 200 of memory cells, constituted from NAND strings 50 such as that shown in FIG. 5A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Sensing Circuits and Techniques

Figure 6:
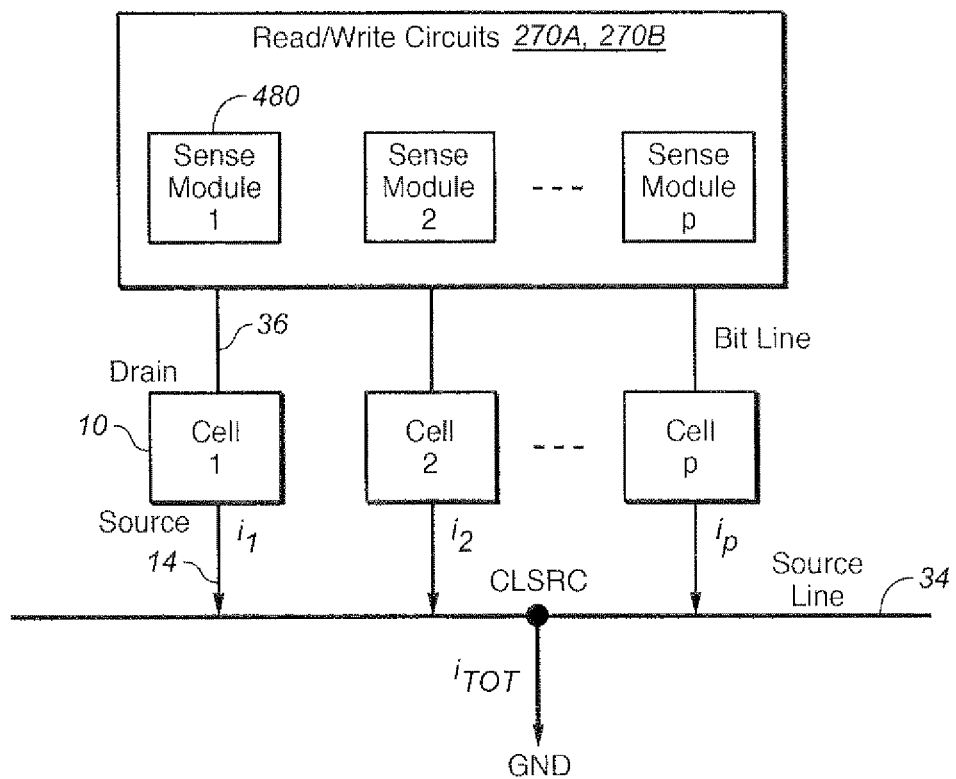
FIG. 6 illustrates the Read/Write Circuits 270A and 270B, shown in FIG. 1, containing a bank of p sense modules across an array of memory cells.

FIG. 6 illustrates the Read/Write Circuits 270A and 270B, shown in FIG. 1, containing a bank of p sense modules across an array of memory cells. The entire bank of p sense modules 480 operating in parallel allows a block (or page) of p cells 10 along a row to be read or programmed in parallel. Essentially, sense module 1 will sense a current $I_1$ in cell 1, sense module 2 will sense a current $I_2$ in cell 2, . . . , sense module p will sense a current $I_p$ in cell p, etc. The total cell current $i_{TOT}$ for the page flowing out of the source line 34 into an aggregate node CLSRC and from there to ground will be a summation of all the currents in the p cells. In conventional memory architecture, a row of memory cells with a common word line forms two or more pages, where the memory cells in a page are read and programmed in parallel. In the case of a row with two pages, one page is accessed by even bit lines and the other page is accessed by odd bit lines. A page of sensing circuits is coupled to either the even bit lines or to the odd bit lines at any one time. In that case, page multiplexers 250A and 250B are provided to multiplex the read/write circuits 270A and 270B respectively to the individual pages.

In currently produced chips based on 56 nm technology p>64000 and in the 43 nm 32 Gbit×4 chip p>150000. In the preferred embodiment, the block is a run of the entire row of cells. This is the so-called "all bit-line" architecture in which the page is constituted from a row of contiguous memory cells coupled respectively to contiguous bit lines. In another embodiment, the block is a subset of cells in the row. For example, the subset of cells could be one half of the entire row or one quarter of the entire row. The subset of cells could be a run of contiguous cells or one every other cell, or one every predetermined number of cells. Each sense module is coupled to a memory cell via a bit line and includes a sense amplifier for sensing the conduction current of a memory cell. In general, if the Read/Write Circuits are distributed on opposite sides of the memory array the bank of p sense modules will be distributed between the two sets of Read/Write Circuits 270A and 270B.

Figure 7:
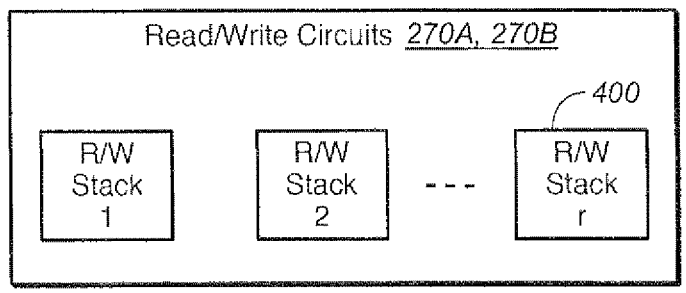
FIG. 7 illustrates schematically a preferred organization of the sense modules shown in FIG. 6.

FIG. 7 illustrates schematically a preferred organization of the sense modules shown in FIG. 6. The read/write circuits 270A and 270B containing p sense modules are grouped into a bank of read/write stacks 400.

Figure 8:
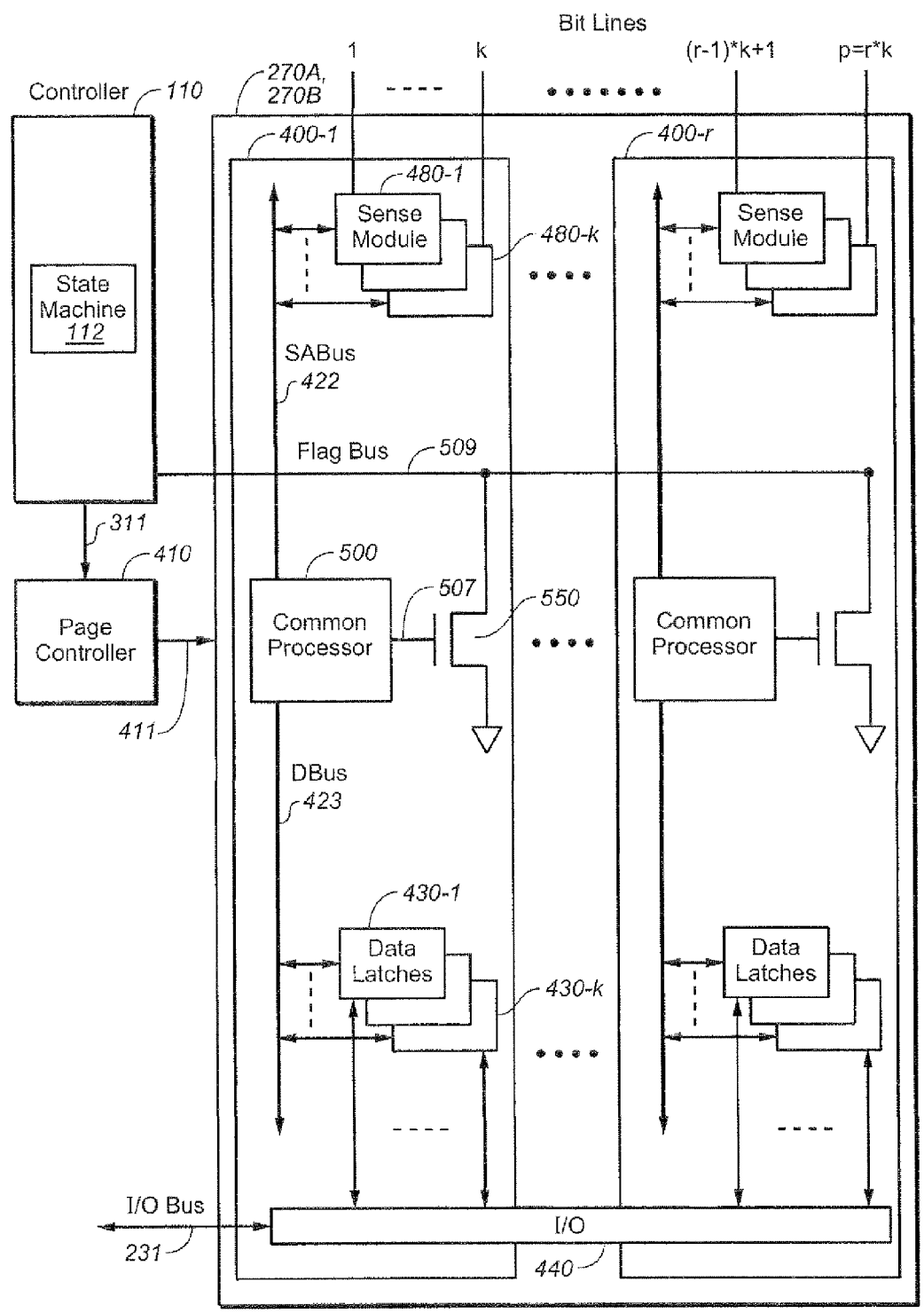
FIG. 8 illustrates in more detail the read/write stacks shown in FIG. 7.

FIG. 8 illustrates in more detail the read/write stacks shown in FIG. 7. Each read/write stack 400 operates on a group of k bit lines in parallel. If a page has p=r*k bit lines, there will be r read/write stacks, 400-1, . . . , 400-r. Essentially, the architecture is such that each stack of k sense modules is serviced by a common processor 500 in order to save space. The common processor 500 computes updated data to be stored in the latches located at the sense modules 480 and at the data latches 430 based on the current values in those latches and on controls from the state machine 112. Detailed description of the common processor has been disclosed in U.S. Patent Application Publication Number: US-2006-0140007-A1 on Jun. 29, 2006, the entire disclosure of which is incorporated herein by reference.

The entire bank of partitioned read/write stacks 400 operating in parallel allows a block (or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p=r*k. One example memory array may have p=150000, k=8, and therefore r=18750.

Each read/write stack, such as 400-1, essentially contains a stack of sense modules 480-1 to 480-k servicing a segment of k memory cells in parallel. The page controller 410 provides control and timing signals to the read/write circuit 370 via lines 411. The page controller is itself dependent on the memory controller 310 via lines 311. Communication among each read/write stack 400 is effected by an interconnecting stack bus 431 and controlled by the page controller 410. Control lines 411 provide control and clock signals from the page controller 410 to the components of the read/write stacks 400-1.

In the preferred arrangement, the stack bus is partitioned into a SABus 422 for communication between the common processor 500 and the stack of sense modules 480, and a DBus 423 for communication between the processor and the stack of data latches 430.

The stack of data latches 430 comprises of data latches 430-1 to 430-k, one for each memory cell associated with the stack The I/O module 440 enables the data latches to exchange data with the external via an I/O bus 231.

The common processor also includes an output 507 for output of a status signal indicating a status of the memory operation, such as an error condition. The status signal is used to drive the gate of an n-transistor 550 that is tied to a FLAG BUS 509 in a Wired-Or configuration. The FLAG BUS is preferably precharged by the controller 310 and will be pulled down when a status signal is asserted by any of the read/write stacks.

Examples of Multi-state Memory Partitioning

A nonvolatile memory in which the memory cells each stores multiple bits of data has already been described in connection with FIG. 3. A particular example is a memory formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits. For example, a memory cell partitioned into four zones can support four states which can be coded as 2-bit data. Similarly, a memory cell partitioned into eight zones can support eight memory states which can be coded as 3-bit data, etc.

Figure 9:
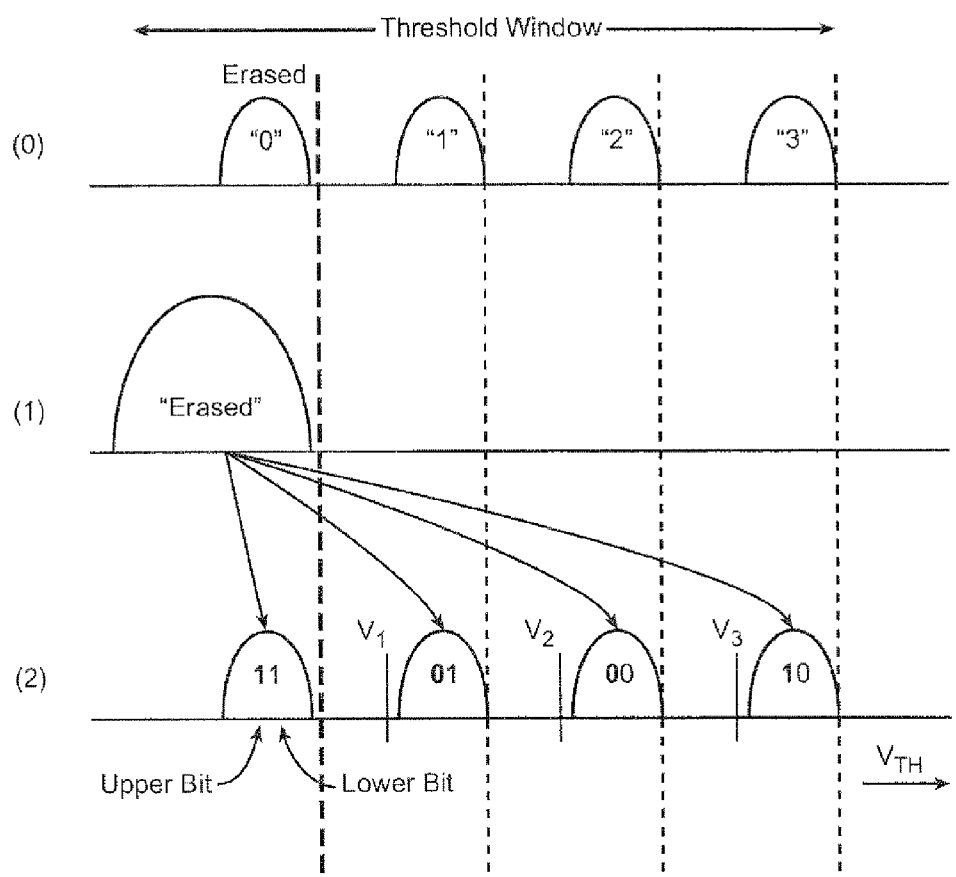
FIGS. 9(0)-9(2) illustrate an example of programming a population of 4-state memory cells.

FIGS. 9(0)-9(2) illustrate an example of programming a population of 4-state memory cells. FIG. 9(0) illustrates the population of memory cells programmable into four distinct distributions of threshold voltages respectively representing memory states "0", "1", "2" and "3". FIG. 9(1) illustrates the initial distribution of "erased" threshold voltages for an erased memory. FIG. 9(2) illustrates an example of the memory after many of the memory cells have been programmed. Essentially, a cell initially has an "erased" threshold voltage and programming will move it to a higher value into one of the three zones demarcated by $DV_1$, $DV_2$ and $DV_3$. In this way, each memory cell can be programmed to one of the three programmed state "1", "2" and "3" or remain un-programmed in the "erased" state. As the memory gets more programming, the initial distribution of the "erased" state as shown in FIG. 9(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $DV_1$, $DV_2$ and $DV_3$ in three sub-passes respectively.

Figure 10:
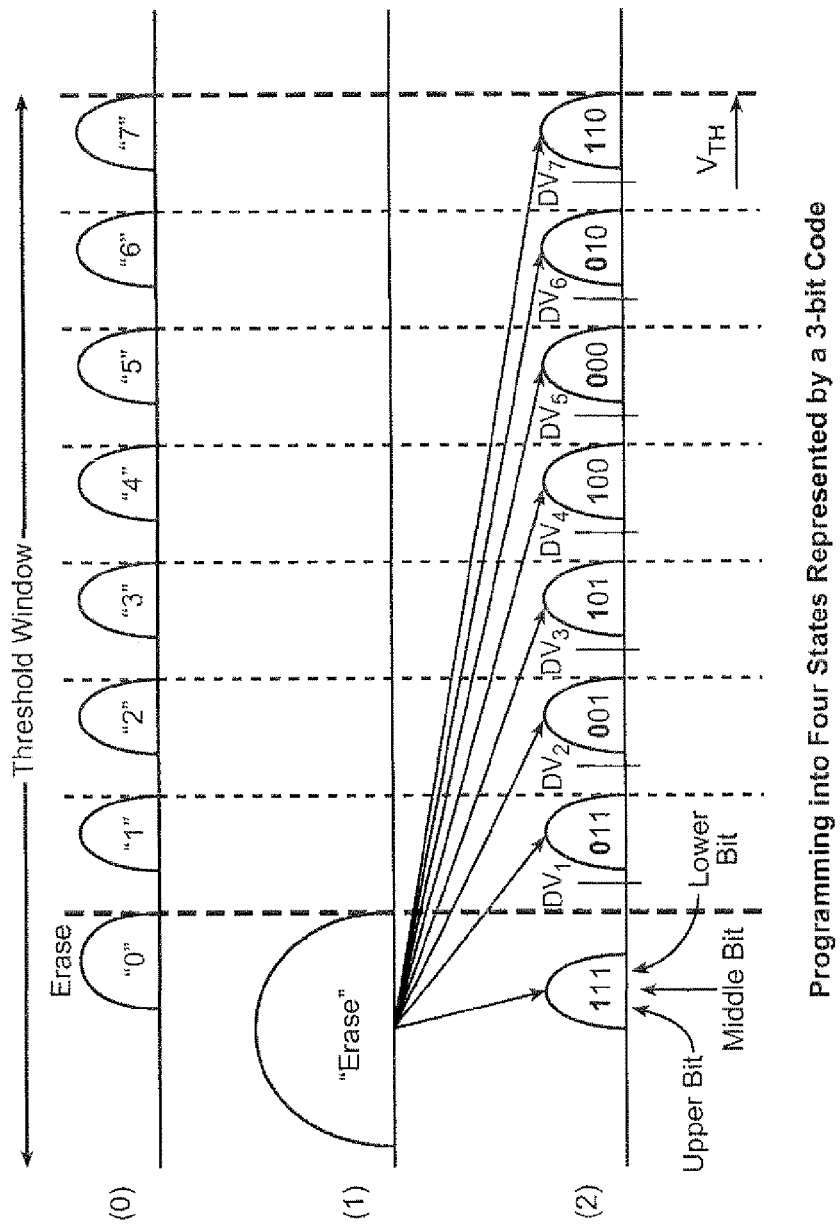
FIGS. 10(0)-10(2) illustrate an example of programming a population of 8-state memory cells.

FIGS. 10(0)-10(2) illustrate an example of programming a population of 8-state memory cells. FIG. 10(0) illustrates the population of memory cells programmable into eight distinct distributions of threshold voltages respectively representing memory states "0"-"7". FIG. 10(1) illustrates the initial distribution of "erased" threshold voltages for an erased memory. FIG. 10(2) illustrates an example of the memory after many of the memory cells have been programmed. Essentially, a cell initially has an "erased" threshold voltage and programming will move it to a higher value into one of the three zones demarcated by $DV_1$-$DV_7$. In this way, each memory cell can be programmed to one of the seven programmed state "1"-"7" or remain un-programmed in the "erased" state. As the memory gets more programming, the initial distribution of the "erased" state as shown in FIG. 10(1) will become narrower and the erased state is represented by the "0" state.

A 3-bit code having a lower bit and an upper bit can be used to represent each of the four memory states. For example, the "0", "1", "2", "3", "4", "5", "6" and "7" states are respectively represented by "111", "011", "001", "101', "100", "000", "010" and '110". The 3-bit data may be read from the memory by sensing in "full-sequence" mode where the three bits are sensed together by sensing relative to the read demarcation threshold values $DV_1$, -$DV_7$ is seven sub-passes respectively.

Page or Word-Line Programming and Verify

One method of programming a page is full-sequence programming. All cells of the page are initially in an erased state. Thus, all cells of the page are programmed in parallel from the erased state towards their target states. Those memory cells with "1" state as a target state will be prohibited from further programming once their have been programmed to the "1" state while other memory cells with target states "2" or higher will be subject to further programming. Eventually, the memory cells with "2" as a target state will also be locked out from further programming. Similarly, with progressive programming pulses the cells with target states "3"-"7" are reached and locked out.

Figure 11:
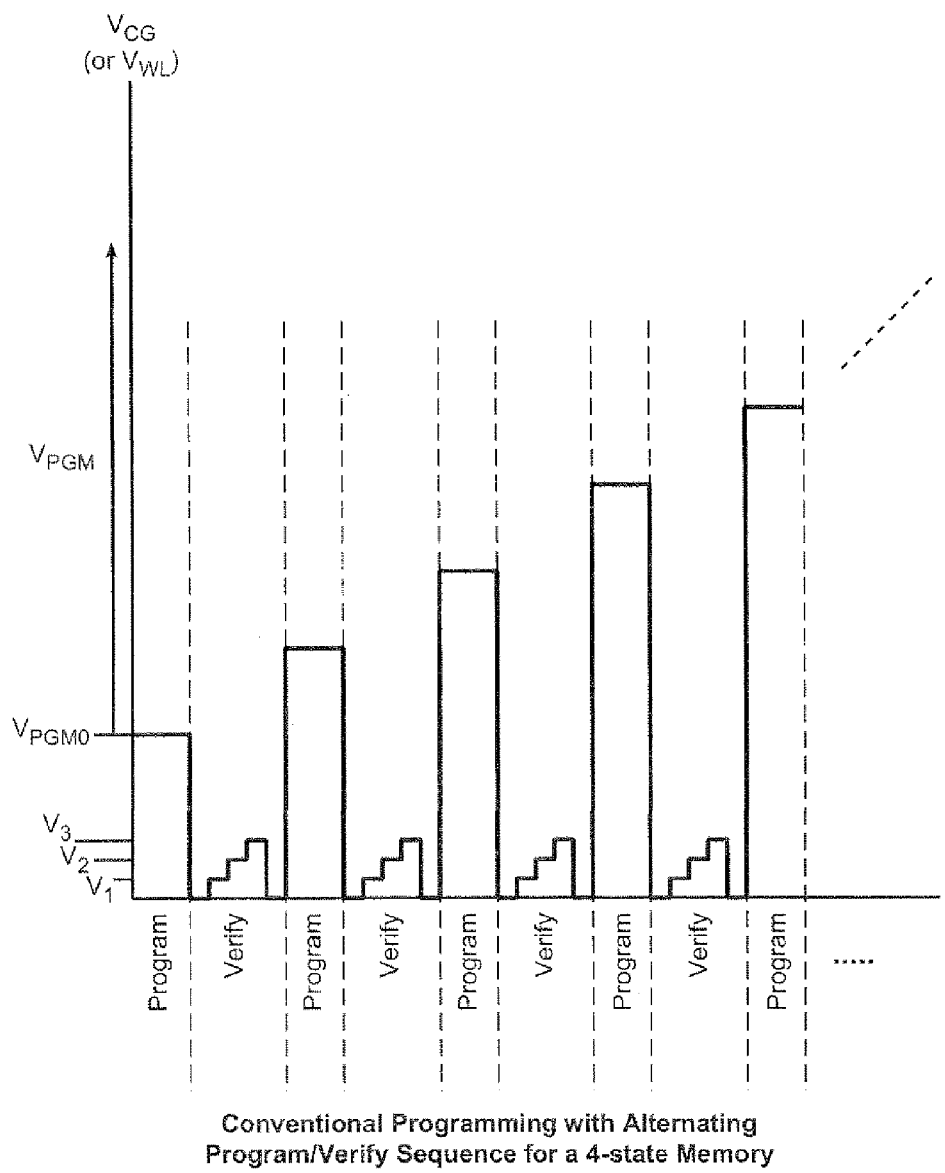
FIG. 11 illustrates a conventional technique for programming a 4-state memory cell to a target memory state.

FIG. 11 illustrates a conventional technique for programming a 4-state memory cell to a target memory state. Programming circuits generally apply a series of programming pulses to a selected word line. In this way, a page of memory cells whose control gates are coupled to the word line can be programmed together. The programming pulse train used may have increasing period or amplitude in order to counteract the accumulating electrons programmed into the charge storage unit of the memory cell. A programming voltage $V_{PGM}$ is applied to the word line of a page under programming. The programming voltage $V_{PGM}$ is a series of programming voltage pulses in the form of a staircase waveform starting from an initial voltage level, $V_{PGM0}$. Each cell of the page under programming is subject to this series of programming voltage pulses, with an attempt at each pulse to add incremental charges to the charge storage element of the cell. In between programming pulses, the cell is read back to determine its threshold voltage. The read back process may involve one or more sensing operation. Programming stops for the cell when its threshold voltage has been verified to fall within the threshold voltage zone corresponding to the target state. Whenever a memory cell of the page has been programmed to its target state, it is program-inhibited while the other cells continue to be subject to programming until all cells of the page have been program-verified.

Staircase Programming Waveform Decomposed into Multiple Passes

The techniques of this section are targeted at reducing various phenomena that can affect the programming accuracy of memory devices, particularly those that arise at small device scales, such as electron de-trapping and Nakamura effects, where the level on one bit-line (whether program enabled or inhibited) noticeably influences the programming on an adjacent bit-line. This is done by transforming one program sequence to multiple program passes without decreasing the performance. By using a large step size for stepping up the program voltage $V_{PGM}$, pre-verify and shifted verify margins, a narrow distribution can be obtained with multiple passes. Also, as discussed further down, a quick pass write (QPW) can be done without the drawback of doing QPW verify.

As the technology shrink in dimension, there are many new phenomena that become relevant. One is the electron de-trapping where the electrons on the floating gate will be de-trapped and lost. Since each electron will count as the technology shrink to scales of tens of nanometers, the de-trapping will cause significant movement in threshold voltages. The de-trapping cells can be re-programmed to help ensure these cells will have sufficient threshold voltage (Vth) values. The multiple pass program of this section can help to re-program the de-trapped cells. (More detail on electron de-trapping and additional techniques for dealing with this problem, complementary to those presented here, can be found in U.S. Pat. No. 6,850,441 and U.S. patent application Ser. No. 13/072,387, filed on Mar. 25, 2011.

Program disturb mechanisms will also affect most the lower states when high $V_{PGM}$ values are applied. The multiple passes will also help take care of the lower state program disturb issues, as the lower state verify can be shifted to compensate the program disturb.

As the neighboring channel will couple the neighboring floating gate during program inhibit when this channel is raised (Nakamura effects), this will cause extra Vth shifts during as the neighbor locks out. By using multiple program passes, in the first pass, a relatively large number of cells will lockout at the same time, resulting in a lot of Nakamura effects to widen the Vth distribution. The second pass will have some cells inhibited from beginning, due to pre-verify. As more passes progress, the number of cells in the same state locking out will be less and less. The final pass will have the least number of the cells programming, most of the cells get inhibited. Therefore, the Nakamura effect should be suppressed.

Figure 12:
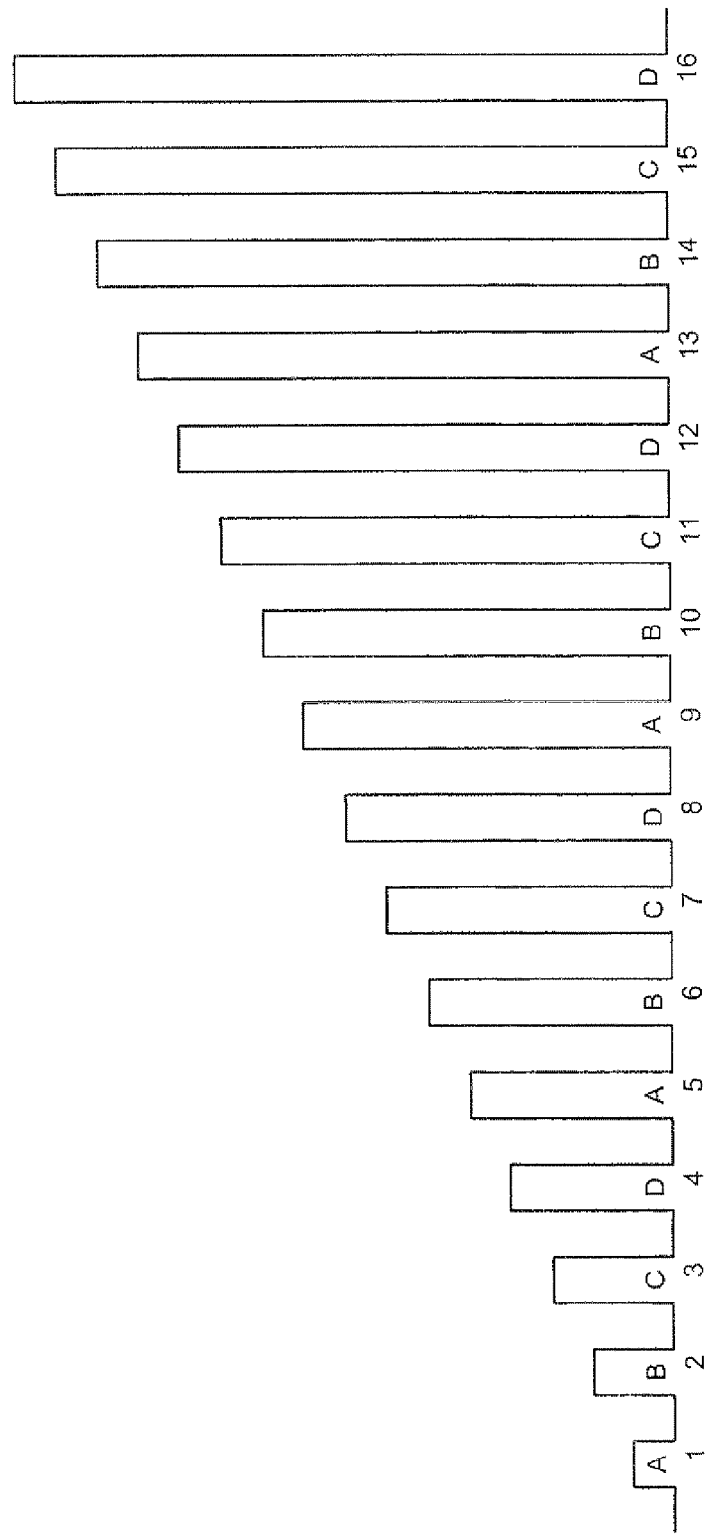
FIG. 12 illustrates breaking up a staircase into subsets.

FIG. 12 shows a typical program sequence using $V_{PGM}$ staircase, similar to FIG. 11 but with the verify in-between the pulses not being explicitly shown. Here are 16 pulses, numbered 1-16, to finish program certain state are shown. The letters A-D here correspond to the subsets into which the staircase will be broken up. The process of programming the cells into a narrow distribution for each of the data states is the process pushing the natural distribution a step at a time. As soon as some bits passed the verify, then the bits will get locked out and no more programming occurs. The natural distribution is gradually moved to get lockout into a narrow distribution.

Figure 13:
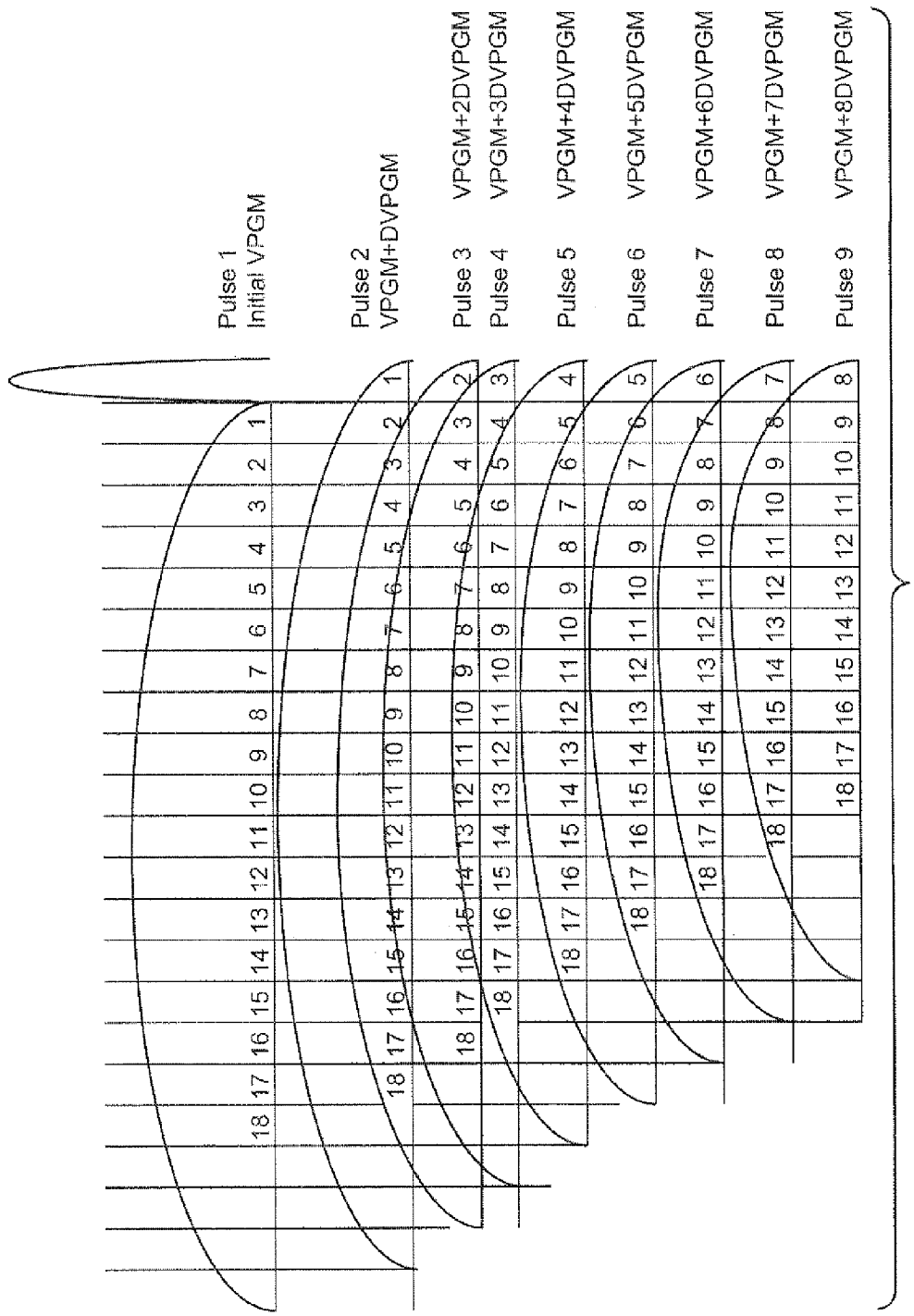
FIG. 13 illustrates the process of locking out the memory cells of a distribution.

The step size of the staircase, DVPGM, will determine the Vth distribution width of the final target. FIG. 13 illustrate the process of locking out. The natural distribution is divided into many slots, the first 18 of which are here numbered. Each slot represents the group of cells requiring certain number of program pulses to reach the program target. The number represents the number of program pulses to finish the program. On the top line, the peaked distribution shows the state that is trying to be achieved. The first pulse is the initial value of $V_{PGM}$ and each subsequent pulse, where 9 pulses are shown here, will shift the first bin in the distribution into the desired level. Each of the subsequent pulses in increased by the step size of DVPGM will move the distribution over, bringing in the next bin of cells.

In the techniques presented in this section, the staircase will be decomposed into multiple subsets. All of the pulses will still be included, but the order is rearranged, so that if N subsets are used, the first subset will the pulses 1, N+1, 2N+1, and so on, with the next subset being the second and every Nth subsequent pulse, and so on for the rest of the N subsets. This program sequence can be taken into 4 parts, for example. The goal is to program in four passes and achieve the same program performance and distribution for the typical program sequence described with respect to FIG. 13.

The program data can be kept in the data latch for all four passes, or the system could read the data from a binary block where the original data is kept in systems using a binary non-volatile cache arrangement (see, for example, US patent publications US-2010-0172179-A1 and US-2010-0172180-A1), and an extra latch can be used to lockout the passing cells. The last pass can release the latch if needed for cache operations. (More information on latch structures is described in U.S. Pat. Nos. 7,158,421 and 7,206,230.) Considering an exemplary embodiment of four passes, in Pass 1, corresponding to the A pulses in FIG. 12, the verify will be shifted away from the target Vth level. This will lockout the corresponding group of cells to prevent over programming, since, otherwise, the larger step size would likely over-program many of the cells. The step size will be 4*DVPGM; for example, the step size is 0.2V for the complete staircase, then 0.8V step can be used for each pass. Before moving on to the next (here, the second) pass, the cells will need to be unlocked.

In Pass 2, a pre-verify at the final targeted Vth can be used to lockout the cells passing the verify before going into second pass program. If some cells from the first pass have de-trapping occur, then this cell will be programmed again in the second pass with a pulse +DVPGM. The second pass verify level is DVPGM level higher than the $1^{st}$ pass, so that although still lowered to prevent over programming, it is still raised above that of the first pass. To account for program disturb on the lower state, the second pass verify level can be little higher than the DVPGM increase for lower state verify. In Pass 3, a pre-verify can again be used at the final targeted Vth to lockout the cells passing the pre-verify before going into third pass program. The third pass verify level is DVPGM level higher than the second pass. For the last subset of Pass 4, the exemplary embodiment again includes a pre-verify at the final targeted Vth that will lockout the cells passing the verify before going into $4^{th}$ pass program. As it is here the last pass, the fourth pass verify level will be at the targeted state verify level.

Figure 14:
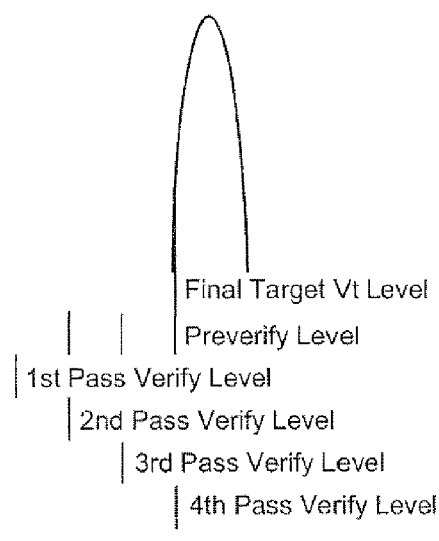
FIG. 14 shows the relation of the verify levels for the different passes.

FIG. 14 illustrates some of the relative voltage levels for pre-verify level and 4 pass verify levels of the exemplary embodiments. The desired sort of tightly peaked final distribution for cells written to a given data state are shown, with this state determined by the final verify level at the lower end of the distribution. (There will be a similar arrangement for each of the non-erased states.) The pre-verify is done at the final verify level, since if a cell to be written to this level is already at this level, it should not be written further. The last pass (4th) will use the final target Vth level, with each of the 3rd, 2nd, and 1st levels increasing stepped down form this final level, each stepped down by an amount taken to the step size of the incremental increase in step size DVPGM. The program verify in between program pulses has to be shifted to accommodate the step sides and lockout a group of cells where some cells may not have reached the target threshold voltage yet, where after each of these initial passes the cells will unlocked before going to the next pass.

Figure 15:
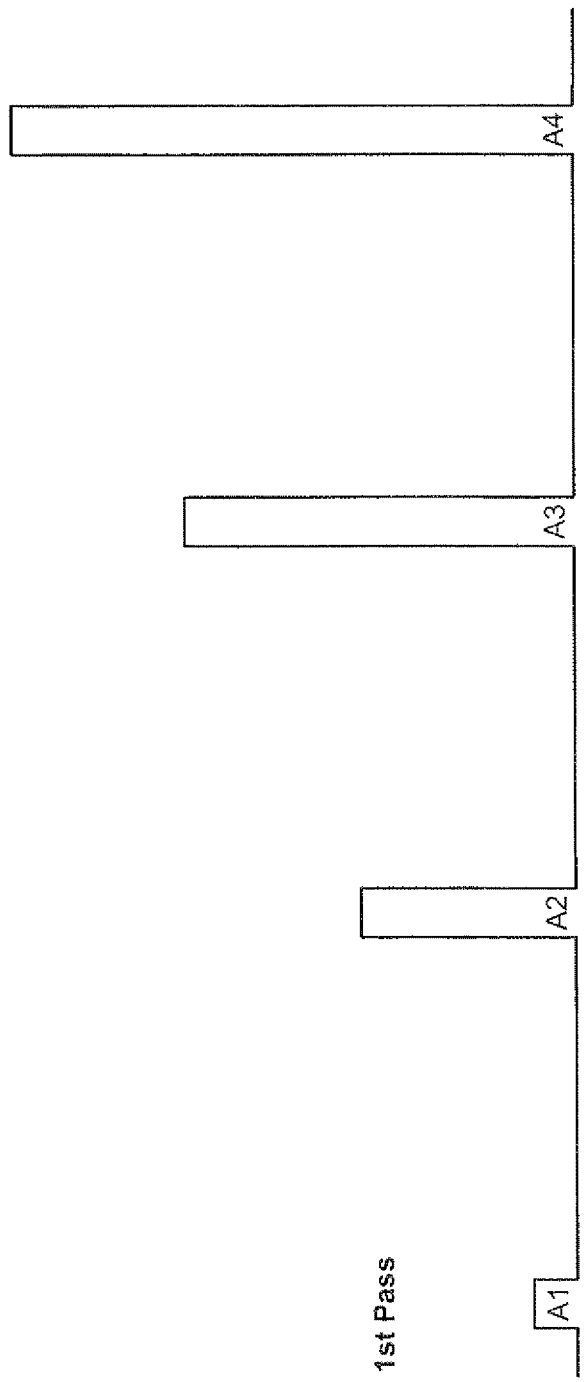
FIGS. 15 and 16 respectively show the pulses of a first pass and the locking out for each pulse.
Figure 16:
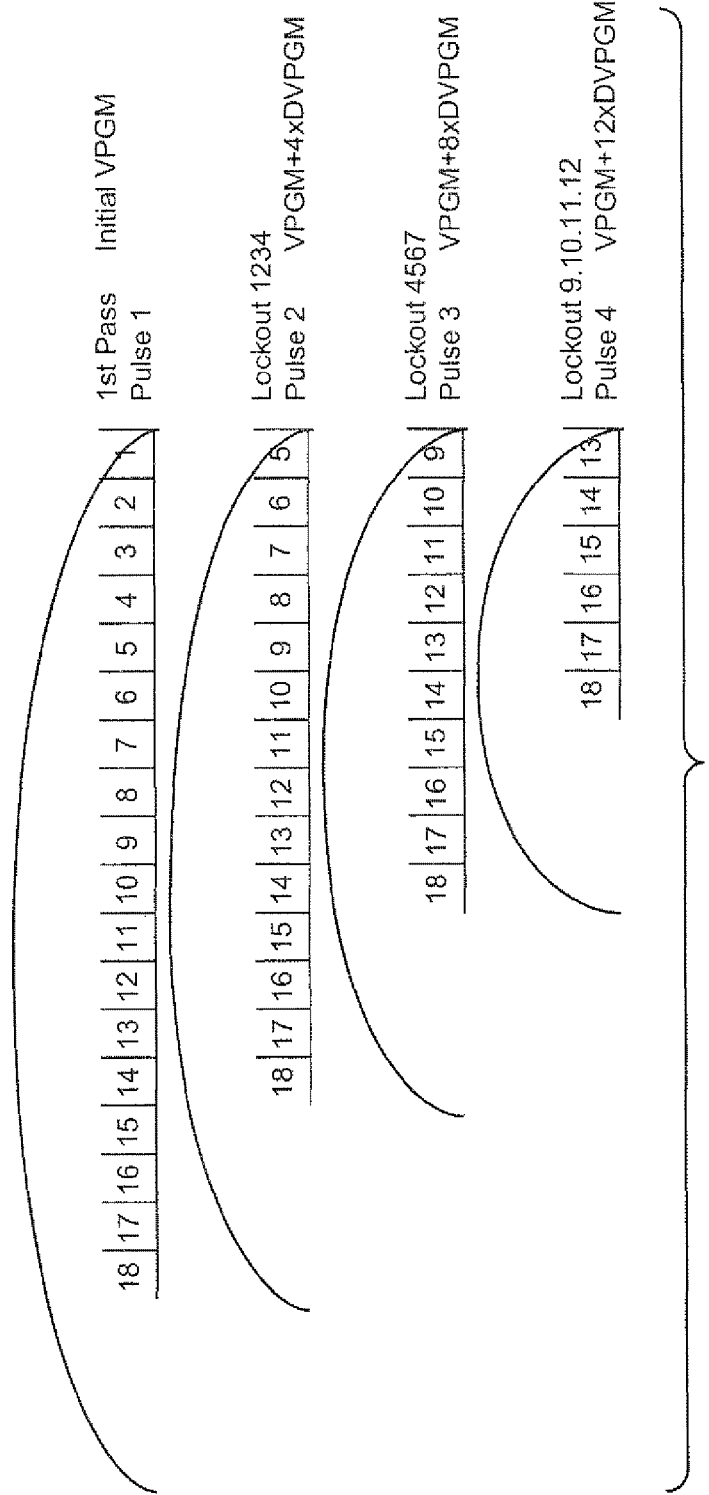

Looking at the first pass, as shown in FIG. 15, the program pulses will be applied with 4 times large step size and correspond to those labeled A in FIG. 12. Here, the A pulses are shown with the same location as in FIG. 12 to help make their relationship more clear, but in practice the actually timing would use the same spacing as between the individual as in FIG. 12 or FIG. 11, where they are placed as closely as practical to allow the needed inter-pulse operations. There will be verify in between the program pulses to lockout corresponding cells, such as shown in FIG. 11, but that were suppressed in FIG. 12 to simplify the discussion, Considering the first pass further, FIG. 16 is the first pass equivalent of FIG. 13. As shown on the top line, the first program pulse in pass 1 will start with the initial VPGM value. Here a smart verify algorithm, such as US patent publications numbers US-2010-0091573-A1 and US-2010-0091568-A1, can be applied on the first pass to search for the VPGM value for this wordline. This new found VPGM value can be stored for future passes. After the first verify, the cells in 1,2,3,4 slots will lock out, even though only slot 1 cells reached their targeted. Vth level, since otherwise the next pulse would cause many of the cells to overshoot. Slots 2,3,4 cells are lockout for the first pass, they will be programmed more in the future passes. The process continues with the subsequent Pass1 pulses, and the subsequent pulse-verify will proceed until all the cells finish the programming. This first pass can also make use of the reduced verify algorithm described in U.S. Pat. No. 7,800,945 to speed up the process.

Figure 17:
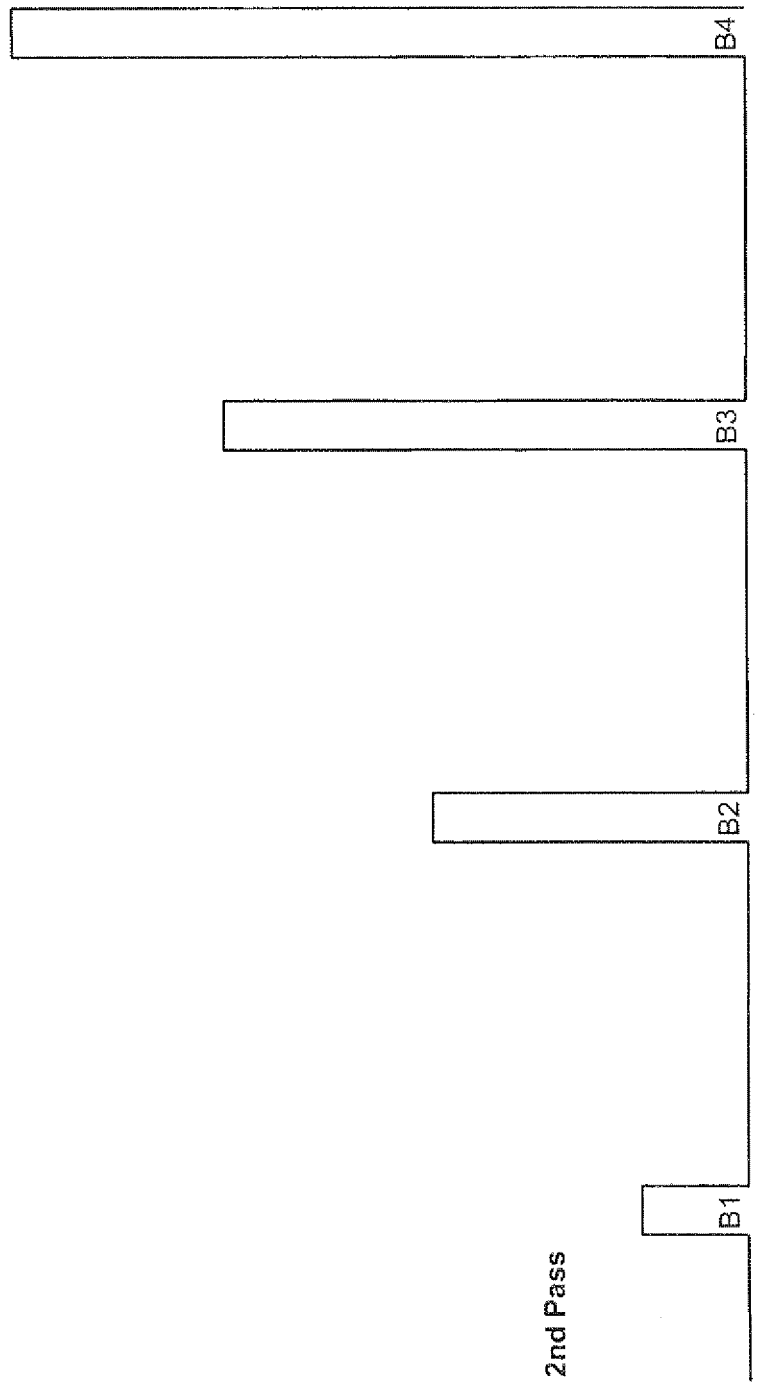
FIGS. 17 and 18 respectively show the pulses of a second pass and the locking out for each pulse.
Figure 18:
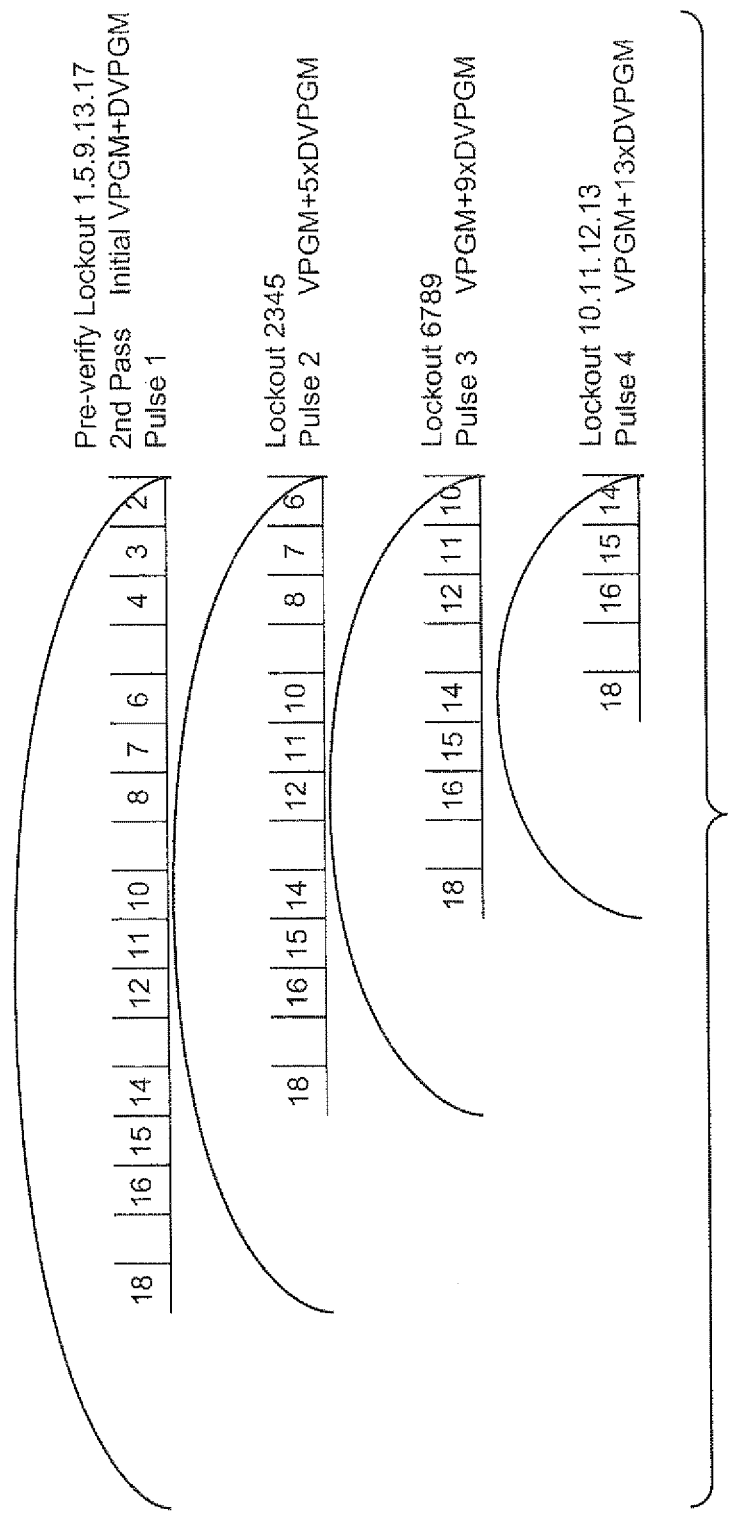

The second pass is represented in FIGS. 17 and 18, which respectively correspond to the first pass FIGS. 15 and 16. After unlocking the cells, the second pass will start with a pre-verify all states before starting program. After the pre-verify, the cells in slots 1, 5,9,13,17 will be locked out for this pass. If some cells have a Vth drop due to de-trapping or other mechanism, they can be programmed again with a pulse one DVPGM increment higher than when previously locked out. In the FIG. 18, the pre-lockout cells have empty slots. The first program pulse will use the VPGM+DVPGM level. The verify levels in between the program pulses are also moved 1 DVPGM higher than the previous pass. The process then continues until all cells lock out at the corresponding second pass verify.

Figure 19:
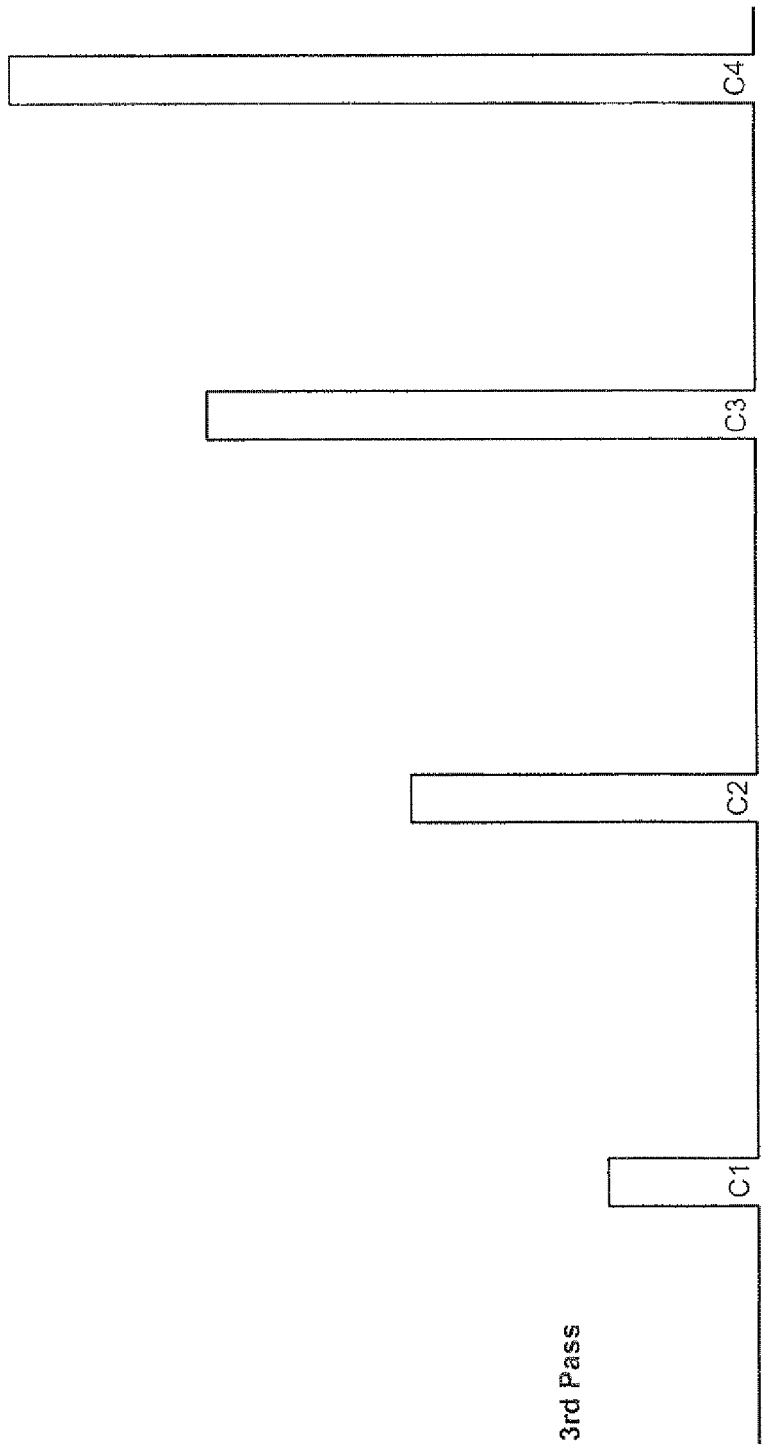
FIGS. 19 and 20 respectively show the pulses of a third pass and the locking out for each pulse.
Figure 20:
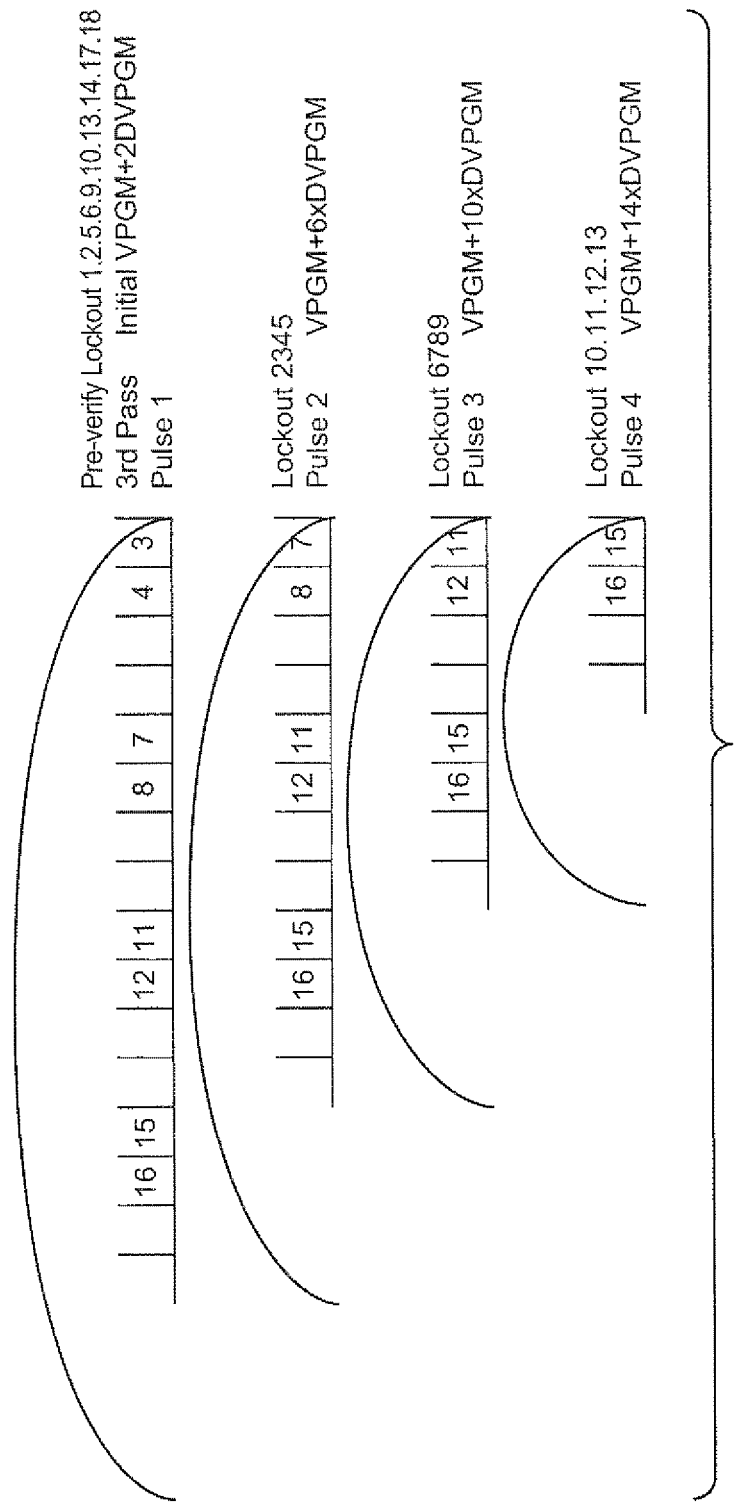

FIGS. 19 and 20 are corresponding third pass figures. For the exemplary embodiment, the third pass will again start with a pre-verify on all states before starting program. After the pre-verify, the cells in slots 1,2,5,6,9,10,13,14,17,18 will be locked out from any programming in this pass. If some cells have Vth drop due to de-trapping, they can be programmed again with a 1 DVPGM higher pulse than last lockout. In the FIG. 20, the pre-lockout cells have empty slots. The first program pulse will use the VPGM+2*DVPGM level, with the verify levels in between the program pulses are also moved 1 DVPGM higher than the previous pass.

Figure 21:
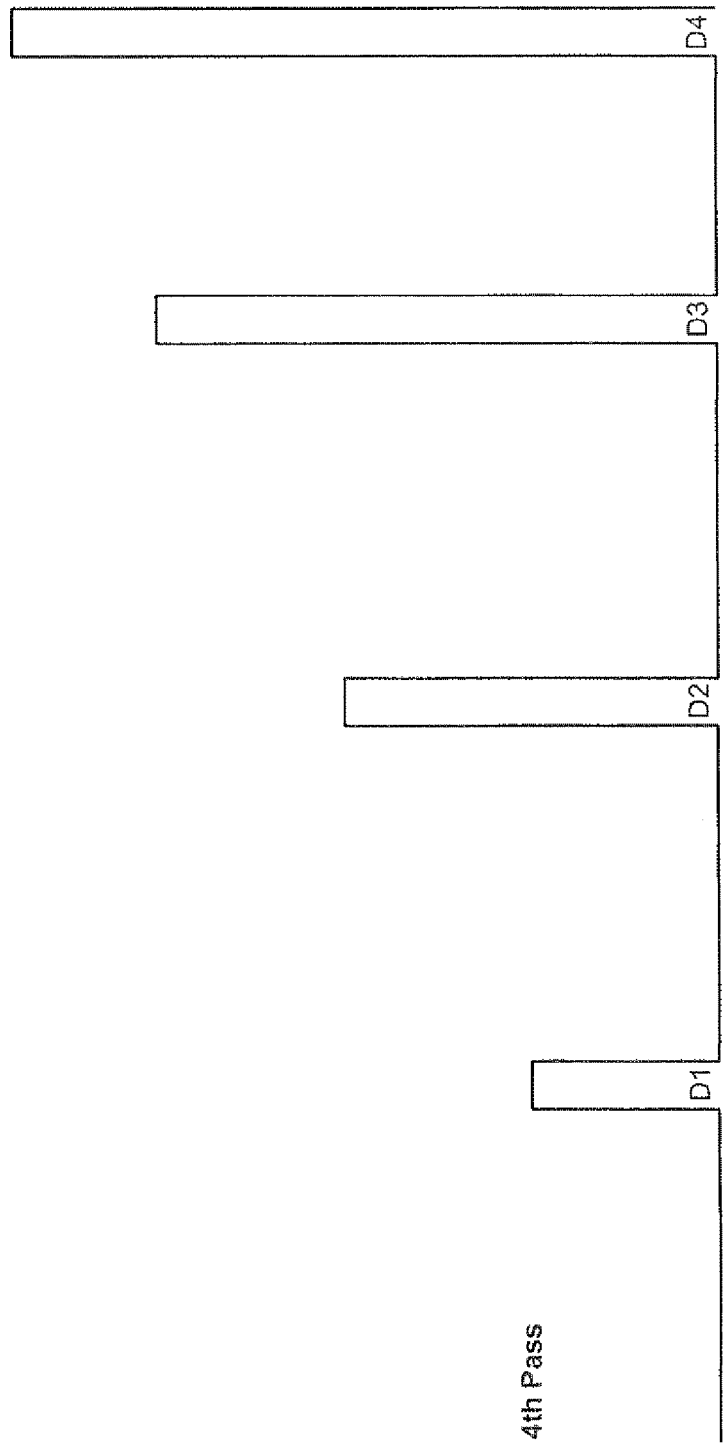
FIGS. 21 and 22 respectively show the pulses of a fourth pass and the locking out for each pulse.
Figure 22:
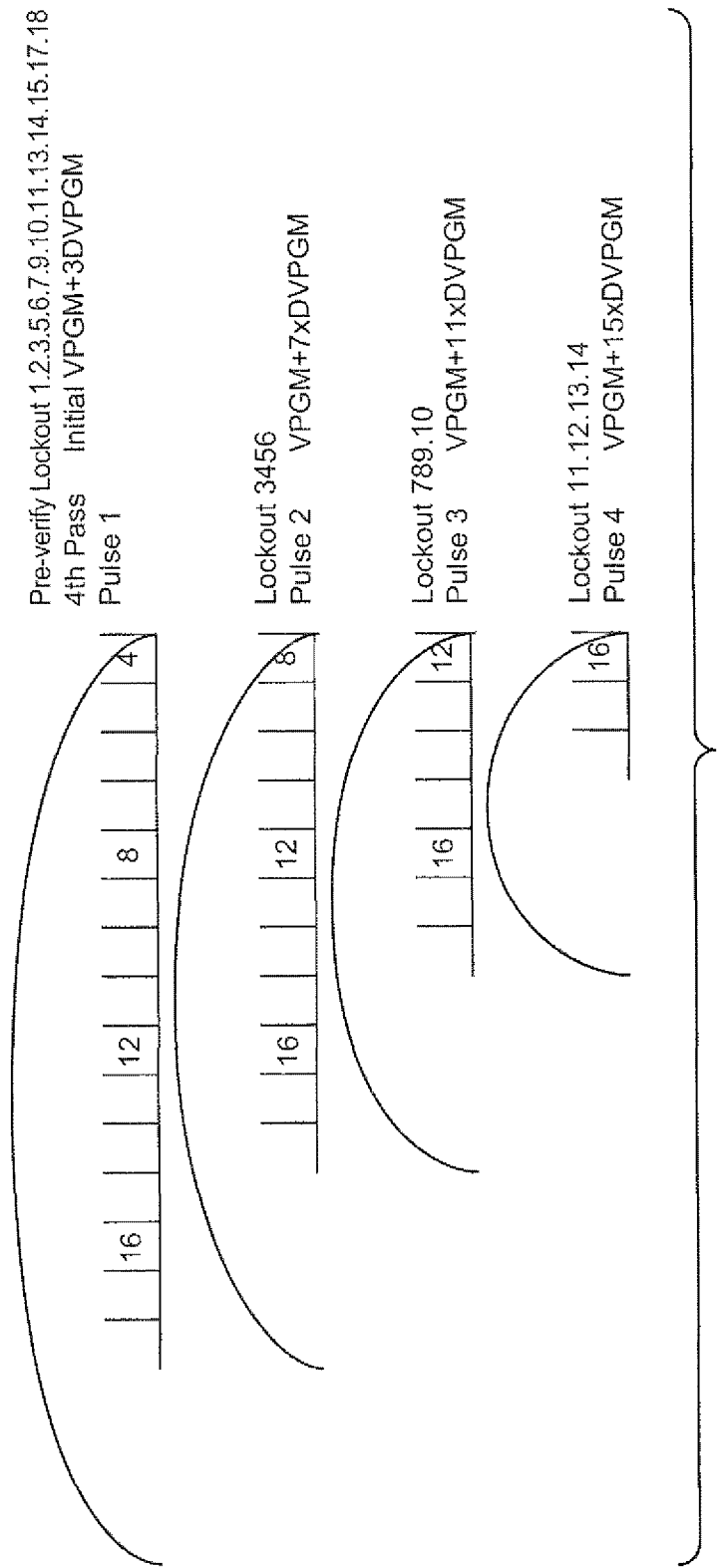

The fourth (and last, in this embodiment) pass is represented in FIGS. 21 and 22. As before, after unlocking, the fourth pass will start with a pre-verify all states before starting to program. After the pre-verify, the cells in slots 1,2,3,5,6,7, 9,10,11,13,14,15,17,18 will be lockout for this pass. If some cells have a Vth drop due to de-trapping or other mechanism, they can be programmed again with 1 DVPGM higher pulse than last lockout. In the FIG. 22, the pre-locked out cells have empty slots. The first program pulse will use VPGM+ 3*DVPGM level. The verify levels in between the program pulses are also moved 1 DVPGM higher than the previous pass. As shown in FIG. 22, there is much smaller number of cells will get programmed and locked out. The lesser population of lockout will significantly reduce the resultant amount of Nakamura effect, which would have lead to higher Vth tail due to channel boosting coupling to the floating gate.

Further, the described framework can incorporate a foggy program as part of the multiple pass program to save on program time; for example, pass 1 can be used as a foggy phase, while 2 passes can be used as fine mode. The first pass can use reduced verify to speed up the program. (For a discussion of foggy programming, where the end result of the programming phase does not resolve the distributions of the different data states to the point where then can be readily read, see U.S. patent application Ser. No. 12/642,740, for example) The verify level between foggy and fine can be adjusted as described further below.

The data latch requirement of the multi-pass algorithm will be the same as in the conventional program algorithm. The total number of program pulses is equal to as single pass arrangement as the same steps are being used, but just with a rearranged order. Each pass will add pre-verify time. By introducing the bigger jumps into each pass, and then backing up for the next pass, this algorithm can accommodate the Vth drop of de-trapping and also can reduce the lower state widening caused by the high VPGM program disturb. The bitline to bitline Yupin effect (capacitive floating gate coupling) can be eliminated similarly to the normal program sequence. The Nakamura effect can also be reduced on the final pass, due to that the program population being only a quarter of the original, with the majority data has been lockout already. During the verify operations, the majority of the population has been programmed, so that it is also very close to the final read bias in terms of overcoming the channel to channel coupling effects.

So far, the different ones of the multiple passes have just been discussed in terms of a single wordline at a time. Although the multiple passes can be performed consecutively on each wordline, it will often be advantageous to work back and forth, jumping between wordlines to minimize the Yupin and other effects. This is a similar situation as when foggy-fine programming or page-by-page programming, such as is described in U.S. patent application Ser. Nos. 12/051,462, 12/051,492, and 12/642,740, for example, where, for example, a lower page is written on WLn, followed by a lower pager on WL(n+1), then coming back for the next page on WLn, and so on. In the currently described multi-pass algorithm, this could translate, for example, a first pass would be done on WLn, followed by the first pass on WL(n+1), then the next pass on WLn, and so on through all the passes on all the wordlines being written.

Figures 23, 25, 26:
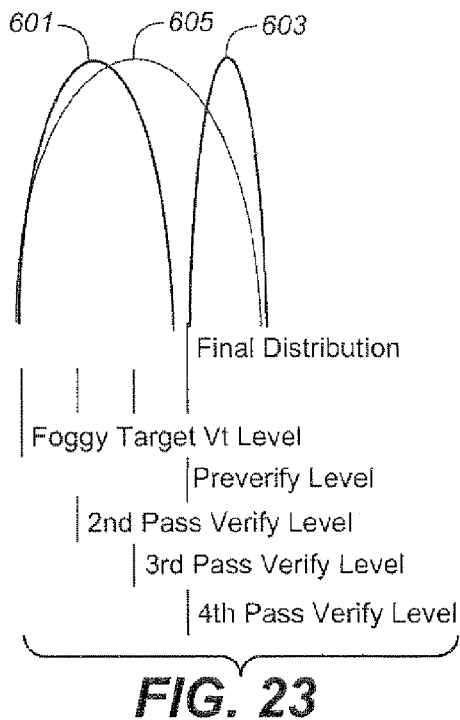
FIG. 23 shows the relationship of verify levels when the first pass is a foggy program operation.
FIGS. 25-27 examples of latch assignments.

Considering the use of a foggy program on the first pass, this allows the first pass to be pre-wordline coupling, and the later passes on post-wordline coupling. FIG. 23 illustrates the corresponding shift in the verify levels for the different passes. The foggy program is done on the first before wordline-wordline capacitive coupling of the Yupin effects. The fine programming can then be done after next wordline is done with its foggy program, post-Yupin effect. The fine verify levels will be different for the different subsequent passes. The distance from the foggy verify level to the lowest fine verify level can be few DVPGM away. The foggy distribution will be wide as the curve 601. After the wordline-wordline coupling by program the next wordline with foggy program, the curve 601 may widen the upper tail to the curve

605. The final distribution 603 upper edge will line up with the curve 605 upper tail. Due to the wordline-wordline Yupin effects, the verify level of the passes should then be adjusted. For example, if there is no wordline-wordline coupling, the system can use, say, a 0.8V step size for all passes to get the final 0.2V final width distribution, with the VPGM and verify level shifting 0.2 V on each pass. With the wordline-wordline coupling from a lower-middle type program sequence for the wordlines (see, for example, U.S. Pat. No. 7,502,255), the system can use 0.7V (or less) step size for all passes)to get the 0.2V width final distribution, with the VPGM and verify level shifting 0.2 V on each pass.

The multi-pass write technique can also incorporate the quick pass write (QPW) technique, which is described in more detail in U.S. Pat. Nos. 7,158,421 and 7,206,230, which also provides more detail on data latch structures that is relevant to parts of the following discussion. In a typical write operation, once a memory cell verifies at its target value, it is locked out from further programming. In the quick pass write arrangement, an additional, lower verify level is used so that when a cell verifies at this lower level, its programming rate is slowed, but not completely locked out, with the lockout then occurring after verifying at the regular level. This is typically accomplished by altering the bias conditions, such as elevating the bitline level somewhat, but not to the full value used for lockout.

Figure 24:
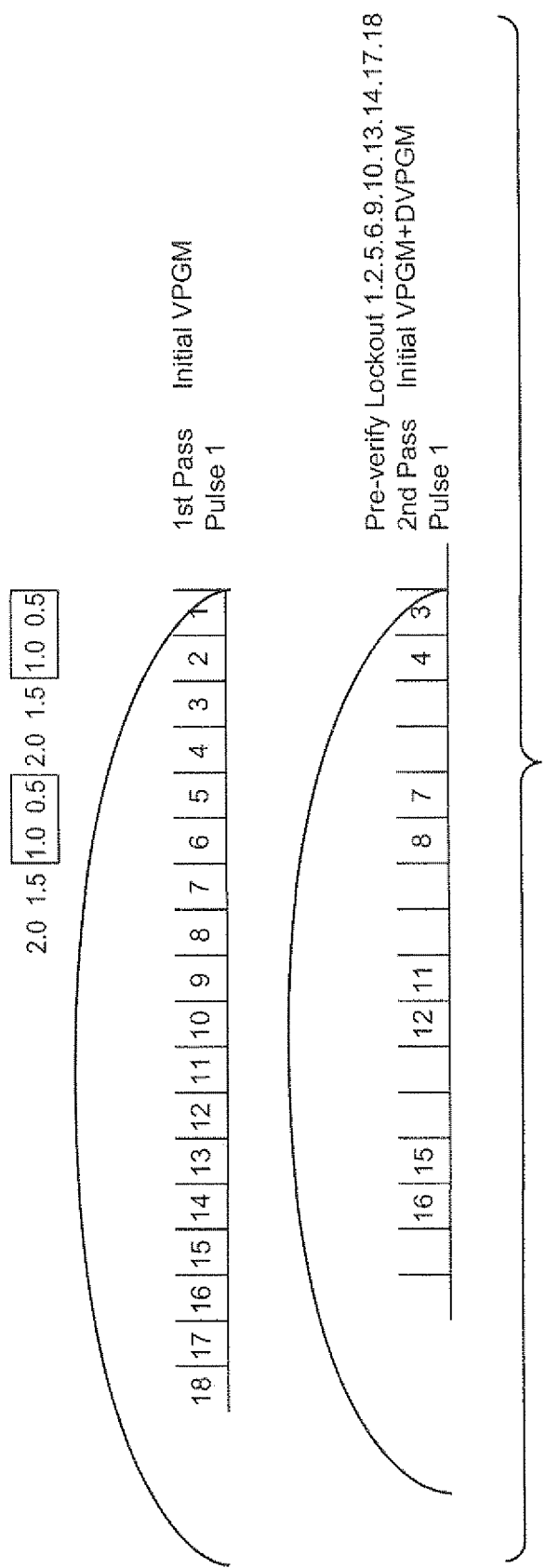
FIG. 24 illustrates a quick pass write example.

The quick pass write program can reduce the number of steps by programming two bins simultaneously, with one slot in slow program mode, with an elevated bitline bias, the other slot in fast program mode, without any inhibition. Referring now to FIG. 24 and its top line, the write will program slots 1 and 2 together with fast program on bin 2 and slow program on bin 1. On next pass, both slot 1 and 2 will lockout. In the exemplary embodiment, only one quick pass pulse will be used in one pass. If another quick pass writes is needed, this will be done in the next pass.

To implement quick pass write an additional data latch can be included for each cell being written, if the original data is to be kept between the different passes. For example, if 2-bits are being written per cell, two latches are used to hold the data, one latch to kept track if the cell has locked out and should be inhibited, and a latch for whether cell has verified at the quick pass write level and needs to be partially inhibited. These assignments are illustrated in FIG. 25, where two latches (ADL, BDL) store two bits of data ("D2 data"), one latch (CDL) indicates if the cell has verified and should be locked out ("Inhibit"), and one latch (DDL) indicates if the cell has verified at the quick pass level and should be switched to the slow mode ("QPW Lockout"). (The exemplary embodiment here is for system storing 2-bits per cell. For other cells with more bits, the number of latches would correspondingly be increased by for each additional bit, or decreased by one for a binary system.)

In an arrangement where the data being written can safely be saved elsewhere, such that the memory includes binary nonvolatile blocks saving the data, the system can directly read back the original data from the binary block or other source, reducing by one the number of data latches needed per cell. (Examples of memory system that store data in a binary form and subsequently re-write it multi-state format, see, for example, US patent publications US-2010-0172179-A1 and US-2010-0172180-A1) An example of an assignment of data latches in such as arrangement is shown in FIG. 26.

Figures 27, 28:
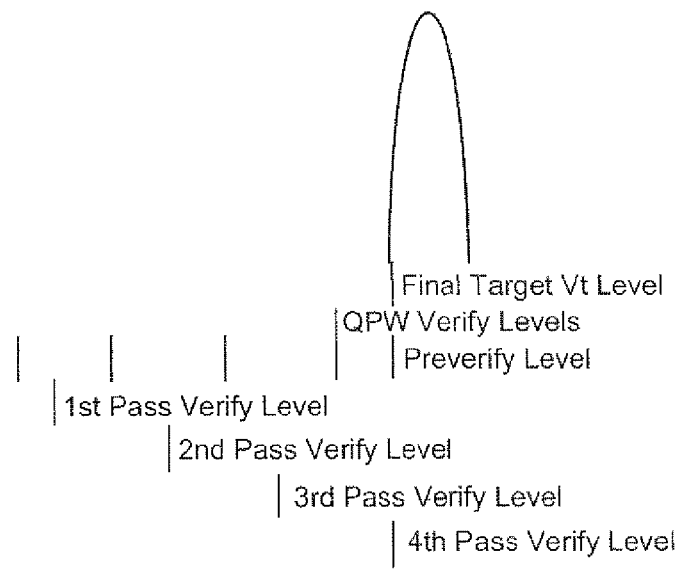
FIG. 28 shows the relationship of verify levels when quick pass write is used.

An example of how the inhibit and quick pass write data latches can translate into the bias levels is shown in FIG. 27. Initially, both latches would be at 0, there would be no inhibition (i.e., bitline at ground), and the cell would have fast programming. When the cell verifies at the quick pass write level, but not the final verify level, the QPW latch would be set to 1, the program rate slowed by raising the bitline slightly. When both the QPW and final verify level are passed, programming on the cell is then inhibited by taking corresponding bitline up the inhibit value.

The quick pass write can program the distribution into ½ DVPGM width in the ideal case. In FIG. 28, the verify levels are illustrated for four passes as well as the quick pass write verify levels. In the exemplary embodiment, the QPW verify is done only at the beginning of each program pass, similarly to pre-verify. The QPW process does not require many additional verify operations and can system can do only one QPW verify per state, with a corresponding time savings.

Figure 29:
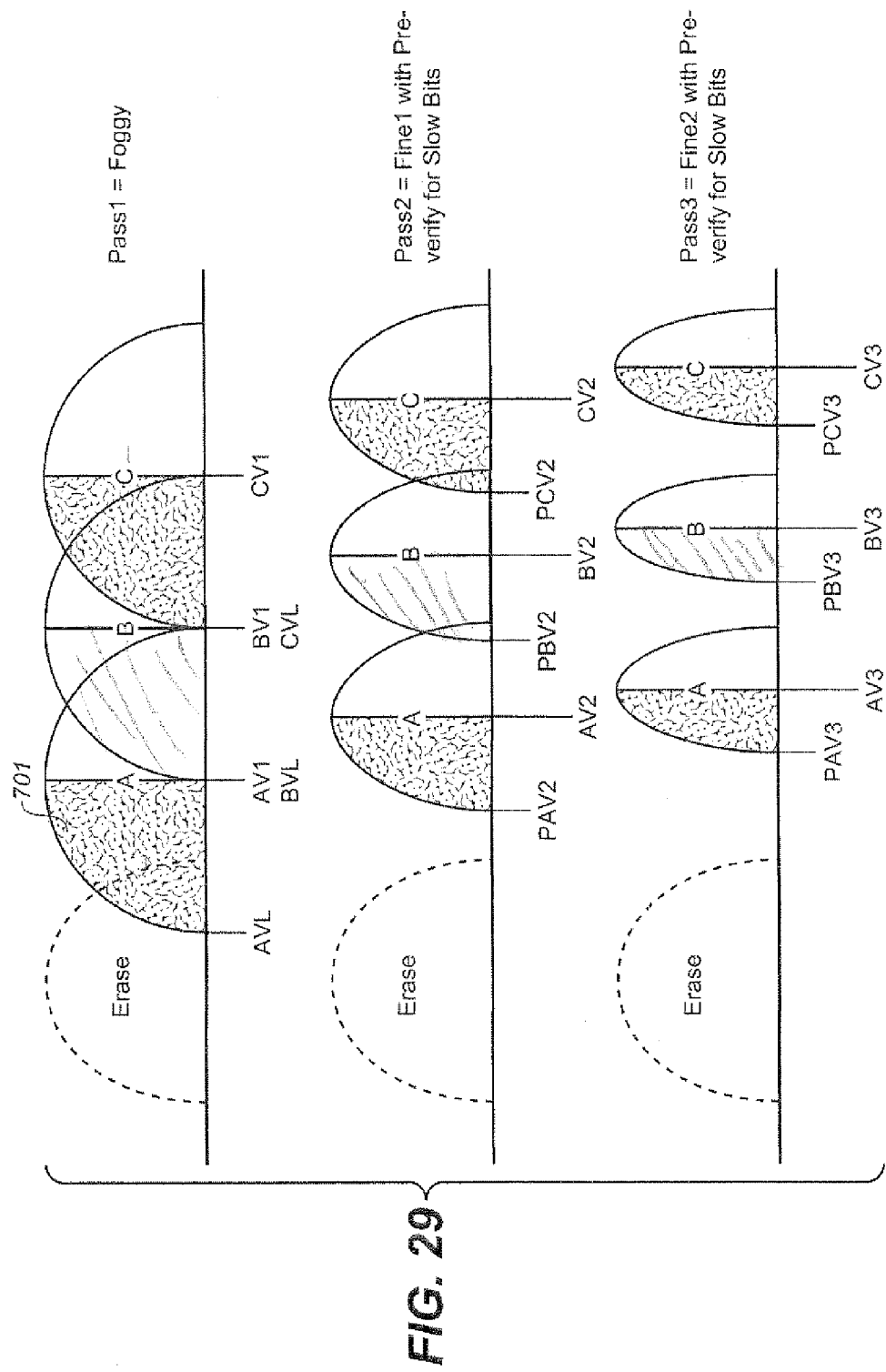
FIG. 29 illustrates an example of sharing verify levels.

A general method to reduce the amount of verify time can be described with respect to FIG. 29. This will again be discussed in the context of system that stores 2-bits per cell, but readily extends to other values. (In FIG. 29, the states are labeled E, for the lowest or "erased" state, and A, B, C for the higher levels programmed out of the E state. The A, B, C, which refer to states, should not be confused with the A, B, C, D of FIG. 12 and others above, where these refer to subsets of the staircase.) FIG. 29 shows three programming passes for a foggy-fine variation, where the first pass of the top line is a foggy pass where the state distributions are still diffuse. The subsequent passes will then be fine-type passes using a pre-verify for the slower bits and will tighten up the distributions. In the first pass, for each state the passes verify level is shown (AV1, BV1, CV1), as well as the lower quick pass write verify level (AVL, BVL, CVL). Note that in this arrangement, the QPW verify (AVL, BVL and CVL) is aligned with the previous state fine verify level: BVL=AV1 and CVL=VB1 and so on. This scheme can be used for other 3 bits/cell verify operations, independently of whether or not the system is using the multiple pass algorithm. For the subsequent passes, for each state is shown a pre-verify level (PAV2, etc.) and the passes verify level (AV1, etc.).

In the multi-pass algorithm, including the foggy-fine variation, the Vth distribution from the previous pass will be cut in half and folded in the present pass. For example, the lower half of the A distribution 701 is folded into the upper half. This make it easy to predict that the cells far from the program target is few. Also the Vth distance from the target level cannot be too far away. The use of a pre-verify at the beginning of the program sequence can allow the slower bits to experience faster programming. Looking that the quick pass write algorithm such as in the first pass of FIG. 29, the low verifies account for half of the total verify time. The amount of verifying can be reduced through a pre-verify at the start of the program sequence once, and then give the low Vth cells a fixed number of full program pulses, followed by use the quick pass write slow program till lockout.

Another, complementary way to reduce the number verify operation in a given pass is through the sharing of verify levels. For example, going back to the first pass (foggy), each state has two different verify levels: the lower, quick pass write verify and the higher level used for fully locking out the cell. As the distributions at this point are fairly broad, the low verify level for one state can also be used for the higher verify level of the next lower state. For example, the BVL can use AV1 to reduce the number of verifies. In the exemplary embodiment, the subsequent pass will only do verify Low once at the beginning of the program sequence. This can allow for the incorporation of a quick pass write without adding the extra verify time, by doing the quick pass write verify once at the beginning of the program pulse.

Conclusion

Although the various aspects of the present invention have been described with respect to certain embodiments, it is understood that the invention is entitled to protection within the full scope of the appended claims.

It is claimed:

1. A method of programming a non-volatile memory device, comprising:
applying pulses forming a staircase of increasing amplitude to a first wordline;
after applying each pulse to the first wordline, performing a verifying operation for memory cells along the first wordline,
wherein the series of pulse is applied to the first wordline as a series of a plurality of N subsets of the staircase, the series including at least a first subset and a second subset, wherein the first subset includes the first and every Nth subsequent pulse of the staircase applied sequentially in order of increasing amplitude, the second subset includes the second and every Nth subsequent pulse of the staircase applied sequentially in order of increasing amplitude, and the second subset is applied subsequent to applying the first subset;
locking out the memory cells along the first wordline from further programming in response to verifying at the subset's verify level corresponding to the cells' target data state, wherein each subset uses a different set of verify levels for verify operations; and
subsequent to applying the first subset and prior to applying the second subset, unlocking the memory cells along the first wordline to allow further programming.

2. The method of claim 1, further comprising:
subsequent to unlocking the memory cells to allow further programming and prior to applying the second subset, performing a pre-verify operation; and
locking from programming by the second subset of those memory cells that pre-verify at a pre-verify level corresponding to the cells' target data state.

3. The method of claim 1, wherein the non-volatile memory stores data in a multi-state format and the verify operation verifies the memory cells along the first wordline for a plurality of the data states.

4. The method of claim 1, wherein the first subset is a foggy programming process, wherein, subsequent to applying the first subset but prior to applying the second subset, the distribution of memory cells are not fully resolved into distinct multi-states.

5. The method of claim 1, further comprising:
for at least one of the first and second subsets, prior to the first pulse, performing an initial verifying operation using a set of initial verify levels that, for each target data state, are lower than the corresponding verify level used for locking out memory cells from further programming; and
altering the bias on the memory cells to program more slowly in response to verifying at the subset's initial verify level corresponding to the cells' target data state.

6. The method of claim 5, further comprising:
for at least one of the first and second subsets, after each pulse, performing the initial verifying operation using a set of initial verify levels that, for each target data state, are lower than the corresponding verify level used for locking out memory cells from further programming; and
altering the bias on the memory cells to program more slowly in response to verifying at the subset's initial verify level corresponding to the cells' target data state.

7. The method of claim 5, wherein the non-volatile memory stores data in a multi-state format and the verify operation verifies the memory cells along the first wordline for a plurality of the data states.

8. The method of claim 7, wherein an initial verify level for a first of the multi-states is the same as the verify level used for locking out a second of the multi-states, the first of the multi-states being different than the second of the multi-states.

9. The method of claim 1, further comprising:
applying pulses forming a staircase of increasing amplitude to a second wordline; and
after applying each pulse to the second wordline, performing a verifying operation for memory cells along the second wordline,
wherein the series of pulse is applied to the second wordline as a series of a plurality of N subsets of the staircase, the series including at least a first subset and a second subset, wherein the first subset includes the first and every Nth subsequent pulse of the staircase applied sequentially in order of increasing amplitude, the second subset includes the second and every Nth subsequent pulse of the staircase applied sequentially in order of increasing amplitude, and the second subset is applied subsequent to applying the first subset;
locking out the memory cells along the second wordline from further programming in response to verifying at the subset's verify level corresponding to the cells' target data state, wherein each subset uses a different set of verify levels for verify operations; and
subsequent to applying the first subset and prior to applying the second subset, unlocking the memory cells along the second wordline to allow further programming,
wherein the first subset along second wordline is applied subsequent to applying the first subset and prior to applying the second subset.

10. The method of claim 9, wherein the second wordline is adjacent to the first wordline.

11. A method of writing a plurality of memory cells each into one of a plurality of target data states, the method including:
applying a series of pulses to a first wordline;
after applying each pulse to the first wordline, performing a verify operation for memory cells along the first wordline, wherein the verify operation includes an initial verify levels and a lockout verify level for each target data state, wherein the initial verify level is lower than the corresponding lock verify level for each of the target data states;
individually altering the bias on the memory cells to program more slowly in response to verifying at the corresponding to the cell's initial verify level; and
individually locking out the memory cells along the first wordline from farther programming in response to verifying at the corresponding to the cell's lockout verify level,
wherein an initial verify level for a first of the multi-states is the same as the lockout verify level for a second of the multi-states, the first of the multi-states being different than the second of the multi-states.

12. The method of claim 11, wherein the verify levels are for a foggy programming process in which the distribution of memory cells are not fully resolved into distinct multi-states.

13. The method of 11, wherein the verify levels are for a multi-pass programming process in which the distribution of memory cells are not fully resolved into distinct multi-states.

* * * * *

UNITED STATES PATENT AND TRADEMARK OFFICE
CERTIFICATE OF CORRECTION

PATENT NO. : 8,432,740 B2  
APPLICATION NO. : 13/188352  
DATED : April 30, 2013  
INVENTOR(S) : Li Page 1 of 1

It is certified that error appears in the above-identified patent and that said Letters Patent is hereby corrected as shown below:

In the Claims

Column 18 line 54 Claim 11 please delete "farther" and insert --further--.

Signed and Sealed this  
First Day of October, 2013

Teresa Stanek Rea  
*Deputy Director of the United States Patent and Trademark Office*